United States Patent
Murata et al.

(10) Patent No.: US 10,692,913 B2
(45) Date of Patent: Jun. 23, 2020

(54) PHOTOELECTRIC CONVERSION ELEMENT, IMAGE PICKUP ELEMENT, LAMINATED IMAGE PICKUP ELEMENT, AND IMAGE PICKUP DEVICE

(71) Applicant: SONY CORPORATION, Tokyo (JP)

(72) Inventors: Masaki Murata, Tokyo (JP); Yasuharu Ujiie, Kanagawa (JP); Shintarou Hirata, Tokyo (JP); Yuya Kumagai, Tokyo (JP)

(73) Assignee: SONY CORPORATION, Tokyo (JP)

( * ) Notice: Subject to any disclaimer, the term of this patent is extended or adjusted under 35 U.S.C. 154(b) by 161 days.

(21) Appl. No.: 15/737,133

(22) PCT Filed: May 30, 2016

(86) PCT No.: PCT/JP2016/065850
§ 371 (c)(1),
(2) Date: Dec. 15, 2017

(87) PCT Pub. No.: WO2016/208326
PCT Pub. Date: Dec. 29, 2016

(65) Prior Publication Data
US 2018/0204865 A1    Jul. 19, 2018

(30) Foreign Application Priority Data

Jun. 25, 2015 (JP) .................................. 2015-127804

(51) Int. Cl.
*H01L 27/146* (2006.01)
*H01L 27/30* (2006.01)
(Continued)

(52) U.S. Cl.
CPC ...... *H01L 27/14627* (2013.01); *H01L 27/146* (2013.01); *H01L 27/14609* (2013.01);
(Continued)

(58) Field of Classification Search
CPC ............. H01L 27/14627; H01L 27/146; H01L 27/14609; H01L 27/14621; H01L 27/307;
(Continued)

(56) References Cited

U.S. PATENT DOCUMENTS

2013/0015547 A1   1/2013  Hamano
2014/0174512 A1*  6/2014  Kuwabara ........... H01L 51/4273
                                             136/251

FOREIGN PATENT DOCUMENTS

JP   2007-214364 A        8/2007
JP   2007214364 A  *      8/2007  ....... H01L 27/14627
(Continued)

OTHER PUBLICATIONS

Hauck, et al., "Tetraazacyclophanes by Palladium-Catalyzed Aromatic Amination. Geometrically Defined, Stable, High-Spin Diradicals", Organic Letters, vol. 1, No. 13, 1999, pp. 2057-2060.
(Continued)

*Primary Examiner* — Georgia Y Epps
*Assistant Examiner* — Don J Williams
(74) *Attorney, Agent, or Firm* — Chip Law Group

(57) ABSTRACT

In an image pickup element or a photoelectric conversion element, at least an anode 21, a carrier blocking layer 22, an organic photoelectric conversion layer 23, and a cathode 25 are laminated in order, and the carrier blocking layer 22 includes a material having the following structural formula
(Continued)

(1), and part of an organic semiconductor material constituting the organic photoelectric conversion layer 23.

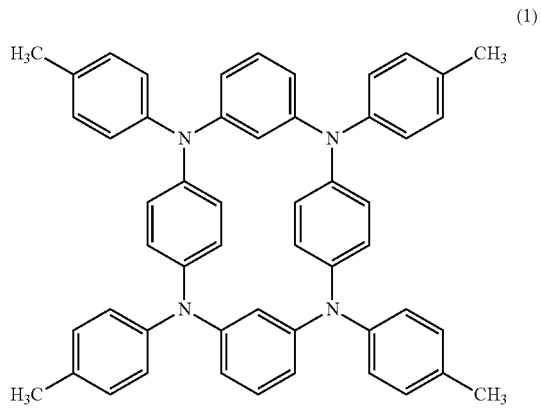

11 Claims, 7 Drawing Sheets

(51) Int. Cl.
H01L 51/42 (2006.01)
H01L 51/00 (2006.01)

(52) U.S. Cl.
CPC ...... *H01L 27/14621* (2013.01); *H01L 27/307* (2013.01); *H01L 51/42* (2013.01); *H01L 51/4246* (2013.01); *H01L 51/0059* (2013.01)

(58) Field of Classification Search
CPC .. H01L 51/42; H01L 51/4246; H01L 51/0059
See application file for complete search history.

(56) References Cited

FOREIGN PATENT DOCUMENTS

| | | |
|---|---|---|
| JP | 2011-228630 A | 11/2011 |
| JP | 2015-092546 A | 5/2015 |
| KR | 10-2013-0038208 A | 4/2013 |
| KR | 10-2016-0043018 A | 4/2015 |
| TW | 201513421 A | 4/2015 |
| WO | 2011/125527 A1 | 10/2011 |
| WO | 2015/045806 A1 | 4/2015 |

OTHER PUBLICATIONS

Xu, et al., "Cyclic arylamines as hole transport materials with high thermal stability for efficient electroluminescence", Thin Solid Films, vol. 516, No. 21, pp. 7720-7726.
International Search Report and Written Opinion of PCT Application No. PCT/JP2016/065850, dated Aug. 9, 2016, 09 pages of ISRWO.

* cited by examiner

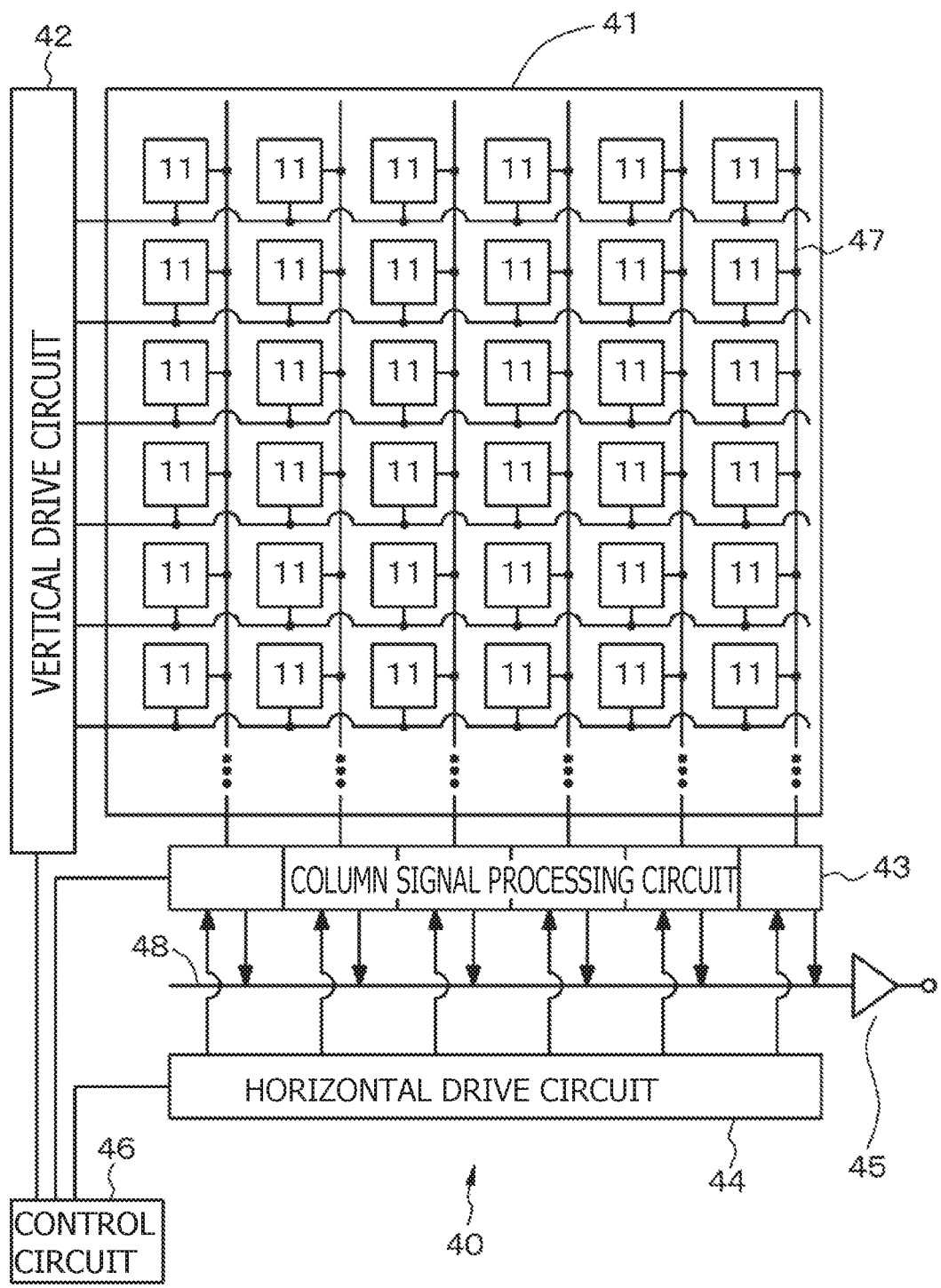

PHOTOELECTRIC CONVERSION ELEMENT, IMAGE PICKUP ELEMENT, LAMINATED IMAGE PICKUP ELEMENT, AND IMAGE PICKUP DEVICE

CROSS REFERENCE TO RELATED APPLICATIONS

This application is a U.S. National Phase of International Patent Application No. PCT/JP2016/065850 filed on May 30, 2016, which claims priority benefit of Japanese Patent Application No. JP 2015-127804 filed in the Japan Patent Office on Jun. 25, 2015. Each of the above-referenced applications is hereby incorporated herein by reference in its entirety.

TECHNICAL FIELD

The present disclosure relates to a photoelectric conversion element, an image pickup element, a laminated image pickup element, and an image pickup device.

BACKGROUND ART

In recent years, for the purpose of coping with various use applications, the enhancement of performance, and diversification of a function of an image pickup element have been promoted, and this image pickup element has continued the evolution thereof. Then, one of next generation technologies can include not photoelectric conversion by inorganic semiconductor materials, but photoelectric conversion with organic semiconductor materials. It should be noted that such an image pickup element is referred to as "an organic image pickup element." In addition, an image pickup element having spectral sensitivities corresponding to a red color, a green color, and a blue color by laminating a plurality of organic semiconductor layers has been being developed (refer to as "a laminated image pickup element") and has attracted attention. Such a laminated image pickup element requires no color separation optical system, and three kinds of electric signals corresponding to a red color, a green color, and a blue color can be taken out from one pixel. Therefore, light utilization is high, an opening is widened, and a false signal like Moire is hard to occur. It is said that in an image pickup element provided with a normal color filter, transmitted light of approximately 40% is lost.

Incidentally, at present, an image pickup element using silicon (Si) as a photoelectric conversion material is a mainstream. Then, miniaturization of a pixel for enhancement of recording density has progressed, and a size of the pixel has reached approximately 1 μm. A light absorption coefficient of Si is in the range of approximately $10^3$ to approximately $10^4$ cm$^{-1}$ in the visible light region, and the photoelectric conversion layer in the image pickup element is normally located in a position of 3 μm or more in depth in the silicon semiconductor substrate. Here, when the miniaturization of the pixel size progresses, an aspect ratio between the pixel size and the depth of the photoelectric conversion layer becomes large. As a result, the light leaks from the adjacent pixel(s), and an incidence angle of the light is limited, which leads to reduction of performance of the image pickup element. As the measures taken for solving such a problem, organic materials each having a large absorption coefficient attract attention. The absorption coefficient of each organic material in the visible light region is in the range of approximately $10^5$ cm$^{-1}$ or more. Thus, in the organic image pickup element or the laminated image pickup element, a thickness of the photoelectric conversion layer can be thinned. For this reason, it is thought that the sensitivity can be enhanced and the number of pixels can be increased while a false color is suppressed, and the development has been earnestly progressed.

In spite of the organic image pickup element which is thought to have many advantages in such a manner, one of problems includes the lowering of a capacitance of an image pickup module. Here, the image pickup module means a device which includes the organic image pickup element built therein, and outputs an electric signal obtained through the photoelectric conversion in the term of an image. The electric charges which are obtained in the photoelectric conversion layer constituting the image pickup element by light irradiation are converted into a voltage which is in turn outputted in the form of an electric signal (image signal). At this time, when in addition to an electric capacitance of the organic image pickup element, a total amount of electric capacitance also including peripheral structures such as floating diffusion (hereinafter, abbreviates as "FD"), and a buffer amplifier connected to FD, and a reset gate and a horizontal output gate adjacent to FD is large, a change in voltage per one electric charge becomes small. Therefore, a signal to noise (S/N) ratio is reduced, and thus the image quality is deteriorated. Here, the voltage V of the electric signal is expressed as follows:

$$V=Q/C$$

where Q is an amount of electric charges. After all, when the electric capacitance of the organic image pickup element becomes large, V is reduced and as a result, the electric signal becomes small. It should be noted that the electric capacitance of the organic image pickup element (specifically, an electric capacitance of an organic layer which will be next described) occupies approximately a half of the total amount C of electric capacitance. In addition, in general, the electric capacitance $C_0$ is expressed by the following expression:

$$C_0=(\varepsilon \cdot S_0)/d_0$$

where ε is a dielectric constant, $S_0$ is an area, and $d_0$ is a thickness. Therefore, the factors which affect the lowering of the capacitance of the organic image pickup element include the dielectric constant of the material constituting the organic image pickup element, and the thickness of the organic layer in the organic image pickup element. Then, when the lowering of the capacitance is realized with the thickness, it is necessary to thick the total thickness of the organic layer of the organic image pickup element.

The organic layer, for example, as depicted in a conceptual view of FIG. 1A, has a laminated structure of a carrier blocking layer (anode-side carrier blocking layer) 22, an organic photoelectric conversion layer 23, and a cathode-side buffer layer 24 which are sandwiched between an anode 21 and a cathode 25. It is possible to thicken a thickness of the organic photoelectric conversion layer 23. However, the organic photoelectric conversion layer 23 is a layer involved in the photoelectric conversion function. Thus, it is difficult in many cases that the increased thickness, and no reduction of the photoelectric conversion efficiency when light having a certain specific wavelength is subjected to the photoelectric conversion are made compatible with each other. In addition, in the case of the laminated image pickup element, when with the spectral characteristics of the material constituting the organic photoelectric conversion layer 23, light other than light having a desired wavelength is also absorbed, if the organic photoelectric conversion layer 23 is thickered, it is feared that the photoelectric conversion layer constituting the image pickup element located below blocks off the light to be absorbed.

CITATION LIST

Patent Literature

[PTL 1]
JP 2007-214364A

Non Patent Literature

[NPL 1]
Organic Letters (1999), 1(13), 2057 to 2060.

SUMMARY

Technical Problem

Incidentally, an organic electroluminescence element provided with a hole injection layer and/or a hole transport layer expressed by only a structural formula (1) which will be described later is well known from JP 2007-214364A. However, this published unexamined patent application does not refer to none of applications to the image pickup element, generally, the photoelectric conversion element, and does not refer to the electric capacitance at all. In addition, in the organic image pickup element, normally, a layer referred to as an anode-side carrier blocking layer or an electron blocking layer as well is formed between the anode and the organic photoelectric conversion layer. However, it became clear that even if the electron blocking layer is constituted from the structural formula (1) disclosed in the above published unexamined patent application, as will be described later, the reduction in external quantum efficiency, and the increase in dark current are remarkable, and the S/N ratio is low.

Accordingly, an object of the present disclosure is to provide a photoelectric conversion element, and an image pickup element each having a structure in which the problems such as the reduction in external quantum efficiency, and the increase in dark current, and a low S/N ratio are hard to occur, a laminated image pickup element and an image pickup device each constituted such an image pickup element.

Solution to Problem

In an image pickup element or a photoelectric conversion element of the present disclosure for attaining the above-mentioned object, at least an anode, a carrier blocking layer, an organic photoelectric conversion layer, and a cathode are laminated in order, and the carrier blocking layer includes a material having the following structural formula (1), and part of an organic semiconductor material constituting an organic photoelectric conversion layer.

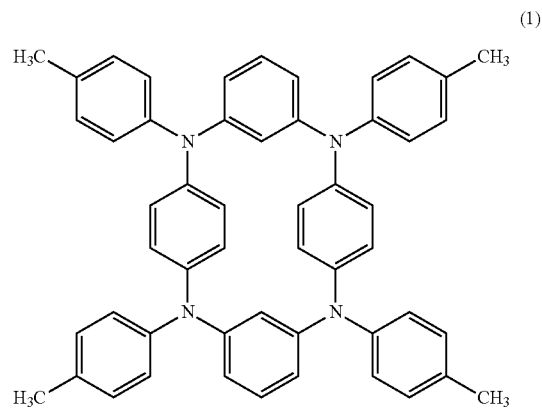

(1)

In a laminated image pickup element (image pickup element complying with longitudinal spectroscopic system) of the present disclosure for attaining the above-mentioned object, at least two image pickup elements of the present disclosure are laminated.

An image pickup device according to a first aspect of the present disclosure for attaining the above-mentioned object is provided with a plurality of image pickup elements of the present disclosure. Such an image pickup device according to the first aspect of the present disclosure can include a structure in which an image pickup element for a blue color, an image pickup element for a green color, and an image pickup element for a red color are arranged on a plane like a Bayer array. In addition, an image pickup device according to a second aspect of the present disclosure for attaining the above-mentioned object is provided with a plurality of laminated image pickup elements of the present disclosure.

Advantageous Effects of Invention

In the photoelectric conversion element of the present disclosure, the image pickup element of the present disclosure, the image pickup element constituting the laminated image pickup element of the present disclosure, and the image pickup element constituting each of the image pickup devices according to the first aspect to the second aspect of the present disclosure (hereinafter, these photoelectric conversion element and image pickup element are collectively referred to as "the image pickup element, etc. of the present disclosure"), the carrier blocking layer includes not only the material having the structural formula (1) in which absorption of visible light is less, but also part of the organic semiconductor material constituting the organic photoelectric conversion layer. Therefore, the excellent external quantum efficiency and the spectral characteristics can be made compatible with each other without disturbing the photoelectric conversion of the image pickup element, etc. including the carrier blocking layer or the image pickup element, etc. located in a lower layer when viewed from a light incidence direction. In addition thereto, the dark current can be suppressed, and the high sensitivity and the high S/N ratio can be obtained. Furthermore, the lowering of the electric capacitance can be made. In addition, as a result of the above, the image pickup device can be realized in which the beautiful view out is possible. It should be noted that the effects described in this specification are merely an exemplification, and are by no means limited. In addition, the additional effect(s) also can be offered.

BRIEF DESCRIPTION OF DRAWINGS

FIG. 3 is a conceptual diagram of the image pickup device of Example 1.

DESCRIPTION OF EMBODIMENTS

Figure 1A:
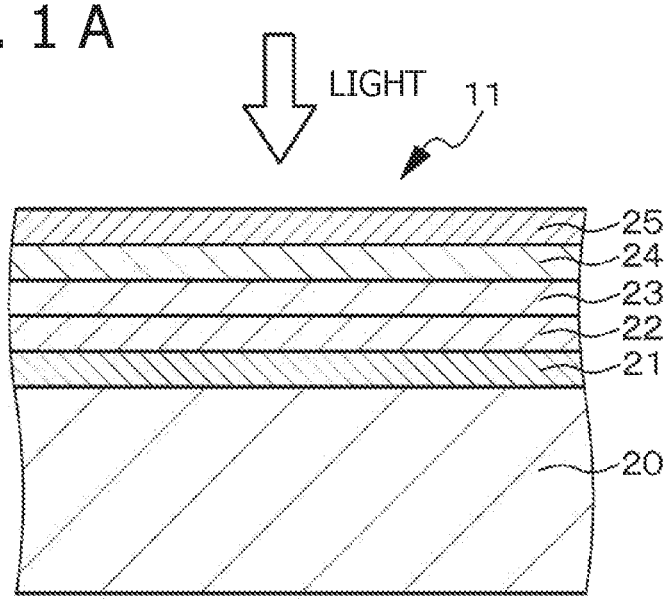
FIG. 1A and FIG. 1B are conceptual views of an image pickup element of Example 1.

Although hereinafter, the present disclosure will be described on the basis of Examples, the present disclosure is by no means limited to Examples, and various numerical values and materials in Examples are exemplifies. It should be noted that the description is given in the following order.
1. A description of the whole of a photoelectric conversion element of the present disclosure, an image pickup element of the present disclosure, a laminated image pickup element of the present disclosure, and image pickup devices according to a first aspect to a second aspect of the present disclosure.
2. Example 1 (a photoelectric conversion element of the present disclosure, an image pickup element of the present disclosure, and an image pickup device according to a first aspect of the present disclosure).
3. Example 2 (a modified change of Example 1, a laminated image pickup element of the present disclosure, and an image pickup device according to a second aspect of the present disclosure).
4. Others.

<Description of Whole of Photoelectric Conversion Element of the Present Disclosure, Image Pickup Element of the Present Disclosure, Laminated Image Pickup Element of the Present Disclosure, and Image Pickup Devices According to First Aspect to Second Aspect of the Present Disclosure>

In a laminated image pickup element of the present disclosure, specifically, a laminated image pickup element of the present disclosure can include a structure in which three image pickup elements: a first image pickup element for a blue color of the present disclosure, a second pickup element for a green color of the present disclosure, and a third image pickup element for a red color of the present disclosure are laminated in a vertical direction. In this case, the first image pickup element of the present disclosure is an image pickup element of the present disclosure having a sensitivity to a blue color and provided with an organic photoelectric conversion layer which absorbs blue-color light (light having a wavelength of 425 nm to 495 nm) (for convenience, referred to as "an image pickup element for a blue color"). The second image pickup element of the present disclosure is an image pickup element of the present disclosure having a sensitivity to a green color and provided with an organic photoelectric conversion layer which absorbs green-color light (light having a wavelength of 495 nm to 570 nm) (for convenience, referred to as "an image pickup element for a green color"). In addition, the third image pickup element of the present disclosure is an image pickup element of the present disclosure having a sensitivity to a red color and provided with an organic photoelectric conversion layer which absorbs red-color light (light having a wavelength of 620 nm to 750 nm) (for convenience, referred to as "an image pickup element for a red color"). It should be noted that an order of lamination of these image pickup elements is preferably an order of the image pickup element for a blue color, the image pickup element for a green color, and the image pickup element for a red color from a light incidence direction, or an order of the image pickup element for a green color, the image pickup element for a blue color, and the image pickup element for a red color from the light incidence direction. The reason for this is because the light having the shorter wavelength is more efficiently absorbed on the incidence surface side. Since the red color has the longest wavelength in the three colors, the image pickup element for a red color is preferably located in the lowermost layer when viewed from the light incidence surface. Alternatively, it is also possible to adopt a structure in which the image pickup element having the sensitivity to the red color is formed in a silicon semiconductor substrate, and the image pickup element having the sensitivity to the green color, and the image pickup element having the sensitivity to the blue color are formed on the silicon semiconductor substrate. Alternatively, it is also possible to adopt a structure in which two kinds of image pickup elements are formed in the silicon semiconductor substrate, and one kind of image pickup element of the present disclosure is formed on the silicon semiconductor substrate. Although the image pickup element formed in the silicon semiconductor substrate is preferably of a backside-illumination type, it can also include a surface-illumination type. The inorganic material constituting the photoelectric conversion layer can also include, in addition to crystal silicon, amorphous silicon, microcrystalline silicon, crystal selenium, and amorphous selenium; compound semiconductors such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$ as chalcopyrite system compounds; or GaAs, InP, AlGaAs, InGaP, AlGaInP, InGaAsP, and also CdSe, CdS, In$_2$Se$_3$, In$_2$S$_3$, Bi$_2$Se$_3$, Bi$_2$S$_3$, ZnSe, ZnS, PbSe, and PbS as group III-V compounds. In addition thereto, quantum dots including these materials can also be used in an inorganic photoelectric conversion layer. In addition, each of image pickup devices according to a first aspect to a second aspect of the present disclosure can constitute a single-plate type color image pickup device.

In the image pickup device according to the second aspect of the present disclosure provided with the laminated image pickup element, unlike the image pickup device provided with the image pickup element having the Bayer array (that is to say, not carrying out a spectrum of a blue color, a green color, and a red color by using color filters), the image pickup elements having the sensitivities to the light having a plurality of kinds of wavelengths are laminated in an incidence direction of light within the same pixel. Therefore, the enhancement of the sensitivity, and the enhancement of the pixel density per unit volume can be promoted. In addition, since the organic material is high in absorption coefficient, a thickness of the organic photoelectric conversion layer can be thinned as compared with the past Si system photoelectric conversion layer. As a result, light leakage from an adjacent pixel(s), and limitation of an incidence angle of the light are relaxed. Moreover, in the past Si system image pickup element, the false color occurs because color signals are generated by carrying out the interpolation processing among the three-color pixels. However, in the image pickup device according to the second aspect of the present disclosure provided with the laminated image pickup element, the occurrence of the false color is suppressed. On the other hand, in the image pickup device according to the first aspect of the present disclosure, the request for the spectral characteristics of the blue color, the green color, and the red color can be relaxed by using the color filters. In addition, the image pickup device according to the first aspect of the present disclosure has the high mass productivity.

A carrier blocking layer (hereinafter, for convenience, referred to as "an anode-side carrier blocking layer") does not disturb the photoelectric conversion function in the organic photoelectric conversion layer. Therefore, the light absorption rate in the visible light region is preferably as small as possible. The image pickup element, etc. of the present disclosure can adopt an aspect in which the light absorption rate of the anode-side carrier blocking layer is 3% or less in the wavelength of 450 nm, 30% or less in the wavelength of 425 nm, and 80% or less in the wavelength of 400 nm. That is to say, the anode-side carrier blocking layer constituted by the material having the above structural formula (1) is excellent in spectral characteristics as well. In general, many organic compounds are high in light absorption strength in the wavelength region on the shorter wavelength side than 450 nm, and thus involve such a problem that they absorb the blue-color light to be absorbed in the organic photoelectric conversion layer of the image pickup element, etc. However, in the image pickup element, etc. of the present disclosure, the material constituting the anode-side carrier blocking layer has the excellent light absorption characteristics, and does not disturb the photoelectric conversion function of the image pickup element, etc.

In the image pickup element, etc. of the present disclosure including the above-mentioned preferred aspects, part of the organic semiconductor material constituting the organic photoelectric conversion layer constituting the carrier blocking layer can adopt an aspect in which the part thereof includes quinacridone (QD) or a quinacridone derivative. In addition, the carrier blocking layer can also adopt a laminated structure consisting of a layer composed of the material having the structural formula (1) and part of the organic semiconductor material constituting the organic photoelectric conversion layer, and the layer including the material having the structural formula (1).

<Quinacridone (QD)>

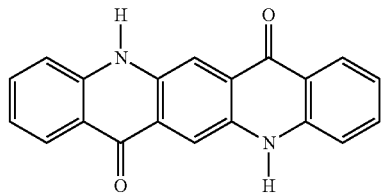 [SMILES: O=c1c2ccccc2[nH]c2cc3c(=O)c4ccccc4[nH]c3cc12]

The quinacridone derivative can include a dialkyl quinacridone class represented by dimethyl quinacridone; a diallyl quinacridone class represented by diphenylquinacridone; a dihalogeno quinacridone represented by dichloroquinacridone; a tetraalkyl quinacridone class represented by tetramethylquinacridone; and a dialkyl tetraalkyl class quinacridone represented by dibutyltetramethyl quinacridone. It should be noted that each of these derivatives has an asymmetric substituent in some cases.

It is possible to exemplify that a thickness of the carrier blocking layer is in the range of $5 \times 10^{-9}$ m to $1.5 \times 10^{-7}$ m, preferably in the range of $5 \times 10^{-9}$ m to $1.0 \times 10^{-7}$ m, and more preferably in the range of $5 \times 10^{-8}$ m to $1.0 \times 10^{-7}$ m. In addition, it is desirable that absorption coefficient α of a photoelectric conversion material layer (or, an organic light absorption material thin film) is $1 \times 10^{4}$ cm$^{-1}$ or more, and preferably $1.5 \times 10^{4}$ cm$^{-1}$ or more. It is desirable that a molar absorption coefficient of the photoelectric conversion material layer (or, an organic light absorption material liquid solution) is $1 \times 10^{4}$ dm$^{3}$·mol$^{-1}$·cm$^{-1}$ or more and preferably $1.8 \times 10^{4}$ dm$^{3}$·mol$^{-1}$·cm$^{-1}$ or more. Furthermore, a sublimation temperature of the material constituting the photoelectric conversion material layer (or, the organic light absorption material), not limited to, is desirably 250° C. or more. It is possible to exemplify that a molecular weight of the material (or, the organic light absorption material) constituting the photoelectric conversion material layer, not limited to, is 2,000 or less, preferably in the range of 500 to 1,500, and more preferably in the range of 500 to 1,000.

When the image pickup element, etc. of the present disclosure including the above preferred aspect is irradiated with the light, and the organic photoelectric conversion layer carries out the photoelectric conversion, holes and electrons are carrier-separated from each other. In addition, an electrode from which the holes are taken out is assigned an anode, and an electrode from which the electrons are taken out is assigned a cathode. Here, when the laminated image pickup element is structured, it is possible to adopt a structure in which the anode and the cathode include a transparent conductive material(s). Alternatively, when the image pickup element(s), etc. of the present disclosure, for example, are arranged on a plane like the Bayer array, it is possible to adopt a structure in which any one of the anode and the cathode includes the transparent conductive material, and the other includes a metallic material. In this case, it is possible to adopt a structure in which the anode located on the light incidence side includes the transparent conductive material, and the cathode includes Al (aluminum), Al—Si—Cu (alloy of aluminum, silicon, and copper) or Mg—Ag (alloy of magnesium and silver).

Alternatively, it is also possible to adopt a structure in which the cathode located on the light incidence side includes the transparent conductive material, and the anode includes Al—Nd (alloy of aluminum and neodymium) or ASC (alloy of aluminum, samarium, and copper). It should be noted that the electrode including the transparent conductive material is referred to as "a transparent electrode" in some cases. Here, the transparent conductive material constituting the transparent electrode can include a metallic oxide having conductivity. Specifically, it is possible to exemplify an indium oxide, indium tin oxide (including ITO, Sn-doped $In_2O_3$, crystalline ITO, and amorphous ITO), an indium-zinc oxide (IZO) in which indium is added as a dopant to a zinc oxide, an indium gallium oxide (IGO) in which indium is added as a dopant to a gallium oxide, an indium-gallium-zinc oxide (IGZO, In—$GaZnO_4$) in which indium and gallium are added as a dopant to a zinc oxide, IFO (F-doped $In_2O_3$), a tin oxide ($SnO_2$), ATO (Sb-doped $SnO_2$), FTO (F-doped $SnO_2$), a zinc oxide (including ZnO which is doped with another element), an aluminum-zinc oxide (AZO) in which aluminum is added as a dopant to a zinc oxide, a gallium-zinc oxide (GZO) in which gallium is added as a dopant to a zinc oxide, a titanium oxide ($TiO_2$), an antimony oxide, a spinel-type oxide, and an oxide having a $YbFe_2O_4$ structure. Alternatively, it is possible to give a transparent electrode which contains a gallium oxide, a titanium oxide, a niobium oxide, a nickel oxide or the like as a parent layer. A thickness of the transparent electrode can include the range of $2 \times 10^{-8}$ m to $2 \times 10^{-7}$ m, and preferably in the range of $3 \times 10^{-8}$ m to $1 \times 10^{-7}$ m.

Alternatively, when the transparency is unnecessary, the anode having the function as the electrode from which the holes are taken out preferably includes a conductive material having a high work function (for example, $\Phi$=4.5 eV to 5.5 eV) as a conductive material constituting the anode. Specifically, it is possible to exemplify gold (Au), silver (Ag), chromium (Cr), nickel (Ni), palladium (Pd), platinum (Pt), iron (Fe), iridium (Ir), germanium (Ge), osmium (Os), rhenium (Re), and tellurium (Te). On the other hand, the cathode having the function as the electrode from which the electrons are taken out preferably includes a conductive material having a low work function (for example, $\Phi$=3.5 eV to 4.5 eV) as a conductive material constituting the cathode. Specifically, it is possible to give an alkaline metal (such as Li, Na, or K) and a fluoride or oxide thereof, an alkaline earth metal (such as Mg or Ca) and a fluoride or oxide thereof, aluminum (Al), Zinc (Zn), Tin (Sn), thallium (Tl), a sodium-kalium alloy, an aluminum-lithium alloy, a magnesium-silver alloy, a rare earth metal such as indium or ytterbium, or an alloy thereof. Alternatively, the material constituting the anode or the cathode can include a metal such as platinum (Pt), gold (Au), palladium (Pd), chromium (Cr), nickel (Ni), aluminum (Al), silver (Ag), tantalum (Ta), tungsten (W), copper (Cu), titanium (Ti), indium (In), tin (Sn), iron (Fe), cobalt (Co) or molybdenum (Mo), or conductive materials such as alloys containing these metal elements, conductive particles including these metals, conductive particles of alloys containing these metals, polysilicon containing an impurity, a carbon system material, an oxide semiconductor, a carbon nanotube, or graphene. In addition, it is possible to adopt the laminated structure of the layers containing these elements. Moreover, the material constituting the anode or cathode can include an organic material (conductive polymer) such as poly(3,4-ethylene dioxythiophene)/polystyrene sulfonic acid [PEDOT/PSS]. In addition, these conductive materials may be mixed with binder (polymer) to produce paste or ink which may be in turn cured to be used as the electrode.

A dry method or a wet method can be used as a film deposition method for an anode or a cathode. The dry method can include physical vapor deposition (PVD method) and chemical vapor deposition (CVD method). A film deposition method using the principle of the PVD method can include a vacuum evaporation method using resistance heating or high-frequency heating, an electron beam (EB) evaporation method, various sputtering methods (magnetron sputtering method, radio frequency-direct current (RF-DC) coupling type bias sputtering method, an electron cyclotron resonance (ECR) sputtering method, a facing target sputtering method, and a high-frequency sputtering method), an ion plating method, a laser ablation method, a molecular beam epitaxy method, and a laser transfer method. In addition, the CVD method can include a plasma CVD method, a thermal CVD method, a metal organic (MO) CVD method, and a photo-CVD method. On the other hand, the wet method can include methods such as an electrolytic plating method and a non-electrolytic plating method, a spin coating method, an inkjet printing method, a spray coating method, a stamping method, a micro-contact printing method, a flexographic printing method, an offset printing method, a gravure printing method, and a dip method. With regard to the patterning, it is possible to utilize a shadow mask, laser transfer, chemical etching such as photolithography, and physical etching using ultraviolet rays, a laser or the like. A planarization process is carried out for the anode and the cathode when necessary. In this case, a laser planarization method, a reflow method, a Chemical Mechanical Polishing (CMP) method, and the like can be used as the planarization technique.

It is possible to adopt any of three aspects:

(1) An organic photoelectric conversion layer is constituted from a p-type organic semiconductor layer composed of a single layer or a plurality of layers.

(2) An organic photoelectric conversion layer is constituted from a laminated structure of a p-type organic semiconductor layer/an n-type organic semiconductor layer; a laminated structure of a p-type organic semiconductor layer/a mixed layer (bulk-hetero structure) of a p-type organic semiconductor and an n-type organic semiconductor/an n-type organic semiconductor layer; a laminated structure of a p-type organic semiconductor layer/a mixed layer (bulk-hetero structure) of a p-type organic semiconductor and an n-type organic semiconductor; or a laminated structure of an n-type organic semiconductor layer/a mixed layer (bulk-hetero structure) of a p-type organic semiconductor and an n-type organic semiconductor.

(3) An organic photoelectric conversion layer is constituted from a mixed (bulk-hetero structure) of a p-type organic semiconductor and an n-type organic semiconductor. It should be noted that not only two kinds of semiconductor materials, but also three or more kinds of semiconductor materials are included in the bulk-hetero structure.

The organic photoelectric conversion layer, for example, in addition to quinacridone or a quinacridone derivative, is constituted by a p-type organic light-absorbing material or organic transparent material, and/or an n-type organic light-absorbing material or organic transparent material. These organic light-absorbing materials or organic transparent materials can include an aromatic monocyclic system compound, an aromatic fused ring system compound, a hetero-monocyclic system compound, a fused heterocyclic system compound, a polymethine system compound, a π conjugated low-molecular-weight system compound, a carbonium system compound, a styryl system compound, a stilbene system compound, a metal complex system compound, a π conjugated polymer system compound, a σ conjugated system compound, a dye-containing polymeric system compound, and a polymer complex system compound.

The aromatic monocyclic system compound, specifically, can include a triallyl amine system compound and a derivative thereof, a biphenyl system compound and a derivative thereof, and a diphenoquinone system compound and a derivative thereof.

The aromatic fused ring system compound, specifically, can include an acene system compound represented by naphthalene, anthracene, and pentacene and a derivative thereof, a rubrene system compound and a derivative thereof, a phenanthrene system compound and a derivative thereof, a fluoranthene system compound and a derivative thereof, a triphenylene system compound and a derivative thereof, a pyrene system compound and a derivative thereof, a chrysene system compound and a derivative thereof, a perylene system compound and a derivative thereof, a coronene system compound and a derivative thereof, an indene system compound and a derivative thereof, a bianthryl system compound and a derivative thereof, a torianthrylene system compound and a derivative thereof, a fluoranthene system compound and a derivative thereof, an aceanthrylene system compound and a derivative thereof, a pentaphene system compound and a derivative thereof, a tetra-phenylene system compound and a derivative thereof, a peropyrene system compound and a derivative thereof, a terylene system compound and a derivative thereof, a bisanthrylene system compound and a derivative thereof, a quaterterylene system compound and a derivative thereof, an indane system compound and a derivative thereof, and a rubicene system compound and a derivative thereof.

The heteromonocyclic system compound, specifically, can include a thiophene system compound and a derivative thereof, a pyrazoline system compound and a derivative thereof, an azole system compound and a derivative thereof, an oxazole system compound and a derivative thereof, a silole system compound and a derivative thereof, an oxadiazole system compound and a derivative thereof, a pyrane system compound and a derivative thereof, a thiopyrane system compound and a derivative thereof, a pyrazine system compound and a derivative thereof, a triazole system compound and a derivative thereof, a pyrrole system compound and a derivative thereof, a triazole system compound and a derivative thereof, a squarylium system compound and a derivative thereof, a lactam system compound and a derivative thereof, an azobenzene system compound and a derivative thereof, a quinone system compound and a derivative thereof, a furan system compound and a derivative thereof, an azole system compound and a derivative thereof, a pyrrolidone system compound and a derivative thereof, an oxazolene system compound and a derivative thereof, an imidazole system compound and a derivative thereof, a pyrazolone system compound and a derivative thereof, a pyridine system compound and a derivative thereof, a bipyridine system compound and a derivative thereof, a pyridazine system compound and a derivative thereof, a dithiol system compound and a derivative thereof, and a dioxyborane system compound and a derivative thereof.

The fused heterocyclic system compound, specifically, can include a pyrrolopyrrole system compound and a derivative thereof, a diazabicyclo system compound and a derivative thereof, a phthalide system compound and a derivative thereof, a benzoxazole system compound and a derivative thereof, a benzothiophene system compound and a derivative thereof, a benzothiazole system compound and a derivative thereof, an indole system compound and a derivative thereof, an imidazopyridine system compound and a derivative thereof, a benzazole system compound and a derivative thereof, a benzopyran system compound and a derivative thereof, a coumarin system compound and a derivative thereof, a chromone system compound and a derivative thereof, an azacoumarin system compound and a derivative thereof, a quinolone system compound and a derivative thereof, a benzoxazine system compound and a derivative thereof, a phthalazine system compound and a derivative thereof, a quinazoline system compound and a derivative thereof, a quinoxaline system compound and a derivative thereof, a pyrimidopyrimidine system compound and a derivative thereof, a dibenzofuran system compound and a derivative thereof, a carbazole system compound and a derivative thereof, a pyrazoquinoline system compound and a derivative thereof, a naphthalimide system compound and a derivative thereof, a benzquinoline system compound and a derivative thereof, a phenanthridine system compound and a derivative thereof, a phenanthroline system compound and a derivative thereof, a phenazine system compound and a derivative thereof, a pyridoquinoline system compound and a derivative thereof, a dipyrimidopyrimidine system compound and a derivative thereof, a deazaflavin system compound and a derivative thereof, a dioxazine system compound and a derivative thereof, a pyrimidoquinazoline system compound and a derivative thereof, a phenanthazole system compound and a derivative thereof, a pyridoimidazoquinoxaline system compound and a derivative thereof, a benzophenoxazone system compound and a derivative thereof, a thioepindolidione system compound and a derivative thereof, an epindolidione system compound and a derivative thereof, a thioquinacridone system compound and a derivative thereof, a quinacridone system compound and a derivative thereof, a triphenodioxazine system compound and a derivative thereof, a perinone system compound and a derivative thereof, a Peckman dye system compound and a derivative thereof, a naphthyridine system compound and a derivative thereof, a benzofuropyrazine system compound and a derivative thereof, an azathioxanthene system compound and a derivative thereof, and an azanaphthofluoranthene system compound and a derivative thereof.

The polymethine system compound, specifically, can include a methine system compound and a derivative thereof, a polymethine system compound and a derivative thereof, a merocyanine system compound and a derivative thereof, a hemicyanine system compound and a derivative thereof, a streptocyanine system compound and a derivative thereof, an oxanol system compound and a derivative thereof, a pyrylium system compound and a derivative thereof, and a cyanine system compound and a derivative thereof. More specifically, polymethine system can include a phthalocyanine system compound and a derivative thereof, a subphthalocyanine system compound and a derivative thereof, and a dipyrine system compound and a derivative thereof.

The n conjugated low-molecular-weight system compound, specifically, can include a dicyanomethylene system compound and a derivative thereof, and a malenonitrile system compound and a derivative thereof. The carbonium system compound, specifically, can include a xanthen system compound and a derivative thereof, a rhodamine system compound and a derivative thereof, an acridine system compound and a derivative thereof, a thioxanthene system compound and a derivative thereof, and an acridone system compound and a derivative thereof. The styryl system compound, specifically, can include a monofunctional styryl system compound and a derivative thereof, a polyfunctional styryl system compound and a derivative thereof, and a tetrabuthyl butadiene system compound and a derivative thereof. The stilbene system compound, specifically, can include a stilbene system compound and a derivative thereof, an azomethine system compound and a derivative thereof, an azobenzene system compound and a derivative thereof, and a fluorescein system compound and a derivative thereof. The metal complex system compound, specifically, can include a schiffbase system compound and a derivative thereof, a porphyrin system compound and a derivative thereof, a metalloporphyrin system compound and a derivative thereof, a metallodipyrine system compound and a derivative thereof, a lanthanide system compound and a derivative thereof, a metallophthalocyanine system compound and a derivative thereof, and a hydroxyquinolilato complex system compound and a derivative thereof. More specifically, the metal complex system compound can include a tris(8-quinolinolato) metal complex represented by tris(8-quinolinolato)aluminum, and a derivative thereof. The n conjugated polymer system compound, for example, can include a polyphenylene vinylene (PPV) system compound and a derivative thereof, an oligothiophene system compound and a derivative thereof, a polythiophene system compound and a derivative thereof, and a polyalkylfluorene system compound and a derivative thereof. The σ conjugated system compound, specifically, can include an oligosilane system compound and a derivative thereof, and a polysilane system compound and a derivative thereof. In addition, the σ conjugated system compound can include, specifically, as other compounds, an indigo compound and a derivative thereof, a thioindigo compound and a derivative thereof, a spiran compound and a derivative thereof, a silane system compound and a derivative thereof, and a boron system compound and a derivative thereof.

The organic dye material or organic transparent material constituting the n-type organic material layer can include an aromatic ring system compound and a hydrozone system compound. The aromatic ring system compound, specifically, can include a monoamine system compound and a derivative thereof, an alkylene bond system compound and a derivative thereof, an allylene system compound and a derivative thereof, a phenylenecyamine system compound and a derivative thereof, and a star-burst system compound and a derivative thereof.

An organic light-absorbing material or organic transparent material other than the above-mentioned organic light-absorbing material or organic transparent material constituting the photoelectric conversion material layer can include an aromatic ring system compound, a hydrozone system compound, an alicyclic system compound, an aromatic ring system compound, and a heterocyclic ring system compound. The aromatic ring system compound, specifically, can include a monoamine system compound and a derivative thereof, an alkylene bond system compound and a derivative thereof, an allylene system compound and a derivative thereof, a phenylenediamine system compound and a derivative thereof, and a star-burst system compound and a derivative thereof. The alicyclic system compound, specifically, can include a cyclopentadiene system compound and a derivative thereof. The aromatic ring system compound can include a tetraphenylbutadien system compound and a derivative thereof, a p-phenylene system compound and a derivative thereof, and a fluoronylidenemethane system compound and a derivative thereof. The heterocyclic ring system compound, specifically, can include a tiadiazopyridine system compound and a derivative thereof, a pyrrolopyridine system compound and a derivative thereof, a germacyclopentadiene system compound and a derivative thereof, a benzazole system compound and a derivative thereof, and a terryleneimido system compound and a derivative thereof.

A cathode-side buffer layer may be formed between the cathode and the organic photoelectric conversion layer, or an anode-side buffer layer may be formed between the anode and the organic photoelectric conversion layer. The cathode-side buffer layer, for example, can be constituted by an n-type organic material layer (organic dye material or organic transparent material). The anode-side buffer layer can be constituted by a p-type organic material layer (organic dye material or organic transparent material). The n-type organic material (organic dye material or organic transparent material) constituting the cathode-side buffer layer can include the organic light-absorbing material or organic transparent material described above. In addition, other compounds, specifically, can include metals represented by Ca, Mg, Li, Ag, and Al, and inorganic compounds (specifically, halides, oxides, and complex compounds of these metals) of these metals. The p-type organic material (organic dye material or organic transparent material) constituting the anode-side buffer layer can include a p-type organic light-absorbing material or organic transparent material other than the organic light-absorbing material or organic transparent material described above.

A cathode-side carrier blocking layer may be provided between the organic photoelectric conversion layer and the cathode. A material constituting the cathode-side carrier blocking layer can include an aromatic ring system compound, and a hydrazone system compound. The aromatic ring system compound, specifically, can include a monoamine system compound and a derivative thereof, an alkylene linkage system compound and a derivative thereof, an allylene linkage system compound and a derivative thereof, a phenylene cyamine system compound and a derivative thereof, and a star-burst system compound and a derivative thereof. When the cathode-side carrier blocking layer is formed of a film which is as thin as approximately $5 \times 10^{-9}$ m to $2 \times 10^{-8}$ m, it is also possible to use a fullerene class represented by C60 and C70. However, the cathode-side carrier blocking layer is by no means limited to these materials.

In addition, an electron injection layer may be provided between the cathode-side carrier blocking layer and the cathode. A material constituting the electron injection layer, for example, can include an alkaline metal such as lithium (Li), sodium (Na), or kalium (K), and a fluoride and oxide thereof, and an alkaline earth metal such as magnesium (Mg) or calcium (Ca) and a fluoride and oxide thereof.

It is possible to exemplify that a thickness of the organic photoelectric conversion layer, not limited to, for example, is in the range of $1 \times 10^{-8}$ m to $5 \times 10^{-7}$ m, preferably in the range of $2.5 \times 10^{-8}$ m to $3 \times 10^{-7}$ m, more preferably in the range of $2.5 \times 10^{-8}$ m to $2 \times 10^{-7}$ m, and still more preferably in the range of $1 \times 10^{-7}$ m to $1.8 \times 10^{-7}$ m. It should be noted that although the organic semiconductors are classified into p-type and n-type in many cases, the p-type means that it readily transports the holes, and the n-type means that it readily transports the electrons. Hus, the organic semiconductors are not limited to the interpretation that the organic semiconductor has the holes or electrons as the majority carrier in the thermal excitation like the inorganic semiconductors.

A co-evaporation method can be exemplified as a method of depositing the carrier blocking layer. However, the method of depositing the carrier blocking layer is by no means limited thereto, and the carrier blocking layer can also be deposited on the basis of a method of depositing the organic photoelectric conversion layer which will be described below.

The method of depositing the organic photoelectric conversion layer can include a paint-on method, a PVD method, and various CVD methods including an MOCVD method. Here, the paint-on method, specifically, can exemplify a spin coating method; an immersion method; a casting method; various printing methods such as a screen printing method, an inkjet printing method, an offset printing method; and a gravure printing method, a stamping method, a microcontact printing method; a flexographic printing method; a spraying method; a dipping method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spraying coater method, a slit orifice coater method, and a calendar coater method. It should be noted that it is possible to exemplify an organic solvent having nonpolar or low polar such as toluene, chloroform, hexane or ethanole as a solvent in the paint-on method, but the paint-on method is by no means limited thereto. In addition, the PVD method can include: various vacuum evaporation methods such as an electron beam heating method, a resistance heating method, a high-frequency heating method, and flash evaporation; an EB evaporation method; a plasma evaporation method; various sputtering methods such as a diode sputtering method, a DC sputtering method, a DC magnetron sputtering method, a high-frequency sputtering method, a magnetron sputtering method, an RF-DC coupled bias sputtering method, an ECR sputtering method, a facing target sputtering method, a high-frequency sputtering method, an ion beam sputtering method, and a bias sputtering method; and various ion plating methods such as a direct current (DC) method, an RF method, a multi-cathode method, an activation reaction method, an electric field vapor deposition method, a high-frequency ion plating method, and a reactive ion plating method; a laser ablation method; a molecular beam epitaxy method; and a laser transfer method. Alternatively, when the image pickup elements constituting the image pickup device are integrated with one another, it is also possible to adopt a method of forming a pattern on the basis of a pulse laser deposition method (PLD method). In addition, the CVD method can include a plasma CVD method, a thermal CVD method, an MOCVD method, and a photo-CVD method. As far as the patterning, it is possible to utilize a shadow mask, laser transfer, chemical etching using photolithography, etc., physical etching, etc. using ultraviolet rays, the laser, or the like. The planarization process is carried out for the organic layer(s) when necessary. In this case, a laser planarization method, a reflow method, and the like can be used as the planarization process.

The image pickup element or the image pickup device, in addition thereto, may be provided with an on-chip microlens or a light blocking layer when necessary. A drive circuit and wirings for driving the image pickup element, etc. are provided in the image pickup element, etc. A shutter for controlling the incidence of the light to the image pickup element may be disposed when necessary, or in response to the purpose of the image pickup device, the image pickup device may include an optical cut filter. Moreover, the array of the image pickup elements in the image pickup device according to the first aspect of the present disclosure, in addition to the Bayer array, can include an interline array, a G stripe RB checkered array, a G stripe RB full checkered array, a checkered complementary color array, a stripe array, an oblique stripe array, a primary color difference array, a field color difference sequential array, a frame color difference sequential array, a metal oxide semiconductor (MOS) type array, an improved MOS type array, a frame interleave array, and a field interleave array. It should be noted that the photoelectric conversion element of the present disclosure can constitute an optical sensor, an image sensor, and a solar cell in addition to the image pickup device (solid-state image pickup device) such as a television camera.

The image pickup element, etc. of the present disclosure can be formed on a substrate. Here, the substrate can include organic polymer (having a form of a polymer material such as a plastic film, a plastic sheet, or a plastic substrate having the flexibility and including a polymer material) exemplified by polymethylmethacrylate (polymethylmethacrylate, PMMA), polyvinyl alcohol (PVA), polyvinyl phenol (PVP), polyether sulfone (PES), polyimide, polycarbonate (PC), polyethylene-telephthalate (PET), and polyethylene-naphthalate (PEN), or can include mica. When the substrate including such a polymer material having the flexibility is used, for example, the incorporation or integration of the image pickup element, etc. in or with the electronic apparatus having a curved surface shape becomes possible. Alternatively, the substrate can include various glass substrates, various glass substrates on surfaces of which insulating films are formed, a quartz substrate, a quartz substrate on a surface of which an insulating film is formed, a silicon semiconductor substrate, a silicon semiconductor substrate on a surface of which an insulating film is formed, and metallic substrates including various alloys or various metals such as a stainless steel. It should be noted that the insulating film can include: a silicon oxide system material (such as $SiO_x$ or spin-on-glass (SOG)); a silicon nitride ($SiN_Y$); a silicon oxynitride (SiON); an aluminum oxide ($Al_2O_3$); and a metal oxide or a metal salt. In addition, it is also possible to use conductive substrates on the surfaces of which these insulating films (a substrate including a metal such as gold, or aluminum, a substrate including highly oriented graphite). Although the surface of the substrate is desirably smooth, it may have such roughness as not to exert a bad influence on the activities of the organic photoelectric conversion layer. A silanol derivative may be formed on the surface of the substrate by using a silane coupling method, a thin film including a thiol derivative, a carboxylic acid derivative, a phosphoric acid derivative or the like may be formed on the surface of the substrate by using an SAM method or the like, and a thin film including an insulating metal salt or metal complex may be formed on the surface of the substrate by using the CVD method or the like, thereby enhancing the adhesiveness between the electrode and the substrate. In addition, the electrode can also be processed by using oxygen plasma, argon plasma, nitrogen plasma, ozone or the like. This processing can be carried out irrespective of presence or absence of the electrode covering layer, and before or after the coating. The transparent substrate means a substrate including a material which does not excessively absorb the light made incident to the photoelectric conversion material layer through the substrate.

In accordance with circumstances, the electrode and the photoelectric conversion material layer may be covered with a covering layer. A material constituting the coating layer can include: not only an inorganic insulating material exemplified by a metal oxide high-dielectric insulating film such as a silicon oxide system material; a silicon nitride ($SiN_Y$); and an aluminum oxide ($Al_2O_3$), but also an organic insulting material (organic polymer) exemplified by polymethylmethacrylate (PMMA); polyvinyl phenol (PVP); polyvinyl alcohol (PVA); polyimide; polycarbonate (PC); polyethylene-telephthalate (PET); polystyrene; a silanol derivative (silane coupling agent) such as N-2(aminoethyl)3-aminopropyltrimethoxysilane (AEAPTMS), 3-mercaptoprophyltrimethoxysilane (MPTMS), or octadecyltrichlorosilane (OTS); and a linear hydrocarbone class having a functional group capable of being coupled to the electrode at one end of octadecanethiol, dodecylisocyanade or the like, and can also use a combination thereof. It should be noted that a silicon oxide ($SiO_x$), BPSG, PSG, BSG, AsSG, PbSG, a silicon oxynitride (SiON), SOG (spin-on-glass), and a low-dielectric material (such as polyaryl-ether, cycloperfluorocarbon polymer, benzocyclobutene, an annular fluorine resin, polytetrafluoroethylene, flaoroaryl-ether, fluorinated polyimide, amorphous carbon, or organic SOG) can be exemplified as a silicon oxide system material. The dry deposition method or wet deposition method described above, for example, can be used as a method of forming the insulating layer.

The carrier blocking layer is formed of the material having the structural formula (1) (referred to as "one material"), and part of the organic semiconductor material constituting the organic photoelectric conversion layer (referred to as "the other material"), specifically, quinacridone or a quinacridone derivative, for example, thereby resulting in that even when the carrier blocking layer is thickened, the sensitivity is not deteriorated, or photo-generated current value is not reduced, and the high S/N ratio can be obtained. The reason for this can include that the one material and the other material have the high carrier transfer characteristics. On the other hand, the reduction in dark current can be attained. Then, the reason for this can include that the material having the structural formula (1) has the excellent carrier blocking characteristics.

Example 1

Example 1 relates to the photoelectric conversion element of the present disclosure, the image pickup element of the present disclosure, and the image pickup device according to the first aspect of the present disclosure.

Figure 1B:
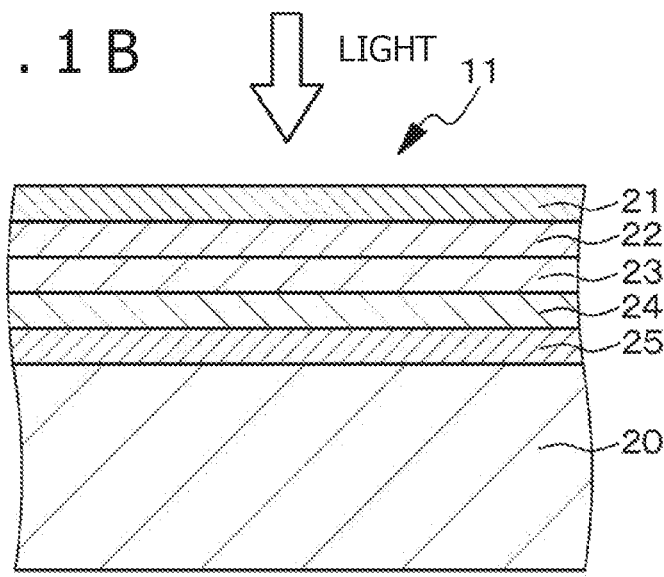

As depicted in conceptual views of FIG. 1A and FIG. 1B, in an image pickup element (photoelectric conversion element) 11 of Example 1, at least an anode 21, a carrier blocking layer (anode-side carrier blocking layer 22), an organic photoelectric conversion layer 23, and a cathode 25 are laminated in order. Specifically, the image pickup element 11 of Example 1 is structured in such a way that the anode 21, the carrier blocking layer (anode-side carrier blocking layer 22), the organic photoelectric conversion layer 23, a cathode-side buffer layer 24, and the cathode 25 are laminated in order. In addition, the anode-side carrier blocking layer 22 includes the material having the above-mentioned structural formula (1), and part of the organic semiconductor material constituting the organic photoelectric conversion layer, specifically, quinacridone or the quinacridone derivative. A thickness of the anode-side carrier blocking layer 22 was set as 70 nm. It should be noted that in the image pickup element depicted in FIG. 1A, light is made incident thereto from the cathode side. On the other hand, in the image pickup element depicted in FIG. 1B, the light is made incident thereto from the anode side. It is also possible to adopt a structure in which the light is made incident from a side of a substrate 20. It should be noted that the flows of holes (indicated by "+" in a circle mark) and electrons (indicated by "−" in a circle mark) generated through the photoelectric conversion are schematically depicted in FIG. 2B.

An image pickup device 40 of Example 1 is provided with a plurality of image pickup elements 11 of Example 1. Specifically, an image pickup element for a blue color, an image pickup element for a green color, and an image pickup element for a red color are arranged on a plane like the Bayer array.

In the organic photoelectric conversion layer 23 in the image pickup element for a blue color having a sensitivity to the blue color, and provided with an organic photoelectric conversion layer which absorbs the blue color light (light having a wavelength of 425 nm to 495 nm), in addition to, quinacridone or the quinacridone derivative, a p-type organic semiconductor can include a naphthalene derivative, an anthracene derivative, a phenanthrene derivative, a tetracene derivative, a picene derivative, a chrycene derivative, a pyrene derivative, a fluoranthene derivative, and a metal complex, and the like. An n-type organic semiconductor can include fullerene and a fullerene derivative, and an organic semiconductor which is higher (deeper) in highest occupied molecular orbital (HOMO) and lowest unoccupied molecular orbital (LUMO) than the p-type organic semiconductor. More specifically, two or more kinds of material species of the organic light absorbing materials or the organic transparent materials (these organic light absorbing materials, or the organic transparent materials can include an aromatic monocyclic system compound, an aromatic fused ring system compound, a heteromonocyclic system compound, a fused heterocyclic system compound, a polymethine system compound, a n conjugated low-molecular-weight system compound, a carbonium system compound, a styryl system compound, a stilbene system compound, a metal complex system compound, a n conjugated polymer system compound, a σ conjugated system compound, a dye-containing polymeric system compound, and a polymer complex system compound) are extracted. In this case, the material which is small (shallow) in both HOMO and LUMO is the p-type organic semiconductor, and the material which is large (deep) in both HOMO and LUMO is the n-type organic semiconductor. Then, it is possible to give a combination in which of the two or more kinds of material species, any one of them absorbs the blue color. It is possible to exemplify that the thickness of the organic photoelectric conversion layer, not limited to, for example, is in the range of $1 \times 10^{-8}$ m to $5 \times 10^{-7}$ m, preferably in the range of $2.5 \times 10^{-8}$ m to $3 \times 10^{-7}$ m, more preferably in the range of $2.5 \times 10^{-8}$ m to $2 \times 10^{-7}$ m, and still more preferably in the range of $1 \times 10^{-7}$ m to $2.5 \times 10^{-7}$ m.

In the organic photoelectric conversion layer 23 in the image pickup element for a green color having the sensitivity to the green color and provided with the organic photoelectric conversion layer which absorbs the green color light (light having wavelength of 495 nm to 570 nm), in addition to quinacridone or the quinacridone derivative, the p-type organic semiconductor can include an anthracene derivative, a phenanthrene derivative, a pyrren derivative, a perylene derivative, a tetracene derivative, a fluoranthene derivative, a sub-phthalocyanine derivative, a metal complex with a heterocyclic compound as a ligand, and the like. The n-type organic semiconductor can include fullerene and a fullerene derivative, an organic semiconductor which is larger (deeper) in HOMO and LUMO than the p-type organic semiconductor, and a transparent inorganic metal oxide. Specifically, the n-type organic semiconductor can include a heterocyclic compound containing a nitrogen atom, an oxygen atom, and a sulfur atom, for example, an organic molecule which has pyridine pyrazine, triazine, quinoline, quinoxaline, acridine, phenazine, phenanthroline, tetrazole, pyrazole, imidazole, thiazole, oxazole, imidazole, benzimidazole, benzoxazole, benzoxazole, benzotriazole carbazole, benzofuran, dibenzofuran, or the like as part of a molecular skeleton, an organic metal complex, and a sub-phethalocyanine derivative. More specifically, two or more kinds of material species of the organic light absorbing materials or the organic transparent materials (these organic light absorbing materials, or the organic transparent materials can include an aromatic monocyclic system compound, an aromatic fused ring system compound, a heteromonocyclic system compound, a fused heterocyclic system compound, a polymethine system compound, a n conjugated low-molecular-weight system compound, a carbonium system compound, a styryl system compound, a stilbene system compound, a metal complex system compound, a n conjugated polymer system compound, a σ conjugated system compound, a dye-containing polymeric system compound, and a polymer complex system compound) are extracted. In this case, the material which is small (shallow) in both HOMO and LUMO is the p-type organic semiconductor, and the material which is large (deep) in both HOMO and LUMO is the n-type organic semiconductor. Then, it is possible to give a combination in which of the two or more kinds of material species, any one of them absorbs the green color. It is possible to exemplify that the thickness of the organic photoelectric conversion layer, not limited to, for example, is in the range of $1\times10^{-8}$ m to $5\times10^{-7}$ m, preferably in the range of $2.5\times10^{-8}$ m to $3\times10^{-7}$ m, more preferably in the range of $2.5\times10^{-8}$ m to $2.5\times10^{-7}$ m, and still more preferably in the range of $1\times10^{-7}$ m to $2.5\times10^{-7}$ m.

In the organic photoelectric conversion layer 23 in the image pickup element for a red color having the sensitivity to the red color and provided with the organic photoelectric conversion layer which absorbs the red color light (light having wavelength of 620 nm to 750 nm), in addition to quinacridone or the quinacridone derivative, the p-type organic semiconductor can include a pentacene derivative, a perylene derivative, a fluoranthene derivative, a phthalocyanine derivative, a sub-phthalocyanine derivative, a metal complex with a heterocyclic compound as a ligand, and the like. An n-type organic semiconductor can include fullerene and a fullerene derivative, an organic semiconductor which is higher (deeper) in HOMO and LUMO than the p-type organic semiconductor, and a transparent inorganic metal oxide. Specifically, the n-type organic semiconductor can include a heterocyclic compound containing a nitrogen atom, an oxygen atom, and a sulfur atom, for example, an organic molecule which has pyridine pyrazine, triazine, quinoline, quinoxaline, acridine, phenazine, phenanthroline, tetrazole, pyrazole, imidazole, thiazole, oxazole, imidazole, benzimidazole, benzoxazole, benzoxazole, benzotriazole carbazole, benzofuran, dibenzofuran, or the like as part of a molecular skeleton, an organic metal complex, and a sub-phethalocyanine derivative. More specifically, two or more kinds of material species of the organic light absorbing materials or the organic transparent materials (these organic light-absorbing materials, or the organic transparent materials can include an aromatic monocyclic system compound, an aromatic fused ring system compound, a heteromonocyclic system compound, a fused heterocyclic system compound, a polymethine system compound, a n conjugated low-molecular-weight system compound, a carbonium system compound, a styryl system compound, a stilbene system compound, a metal complex system compound, a n conjugated polymer system compound, a σ conjugated system compound, a dye-containing polymeric system compound, and a polymer complex system compound) are extracted. In this case, the material which is small (shallow) in both HOMO and LUMO is the p-type organic semiconductor, and the material which is large (deep) in both HOMO and LUMO is the n-type organic semiconductor. Then, it is possible to give a combination in which of the two or more kinds of material species, any one of them absorbs the red color. It is possible to exemplify that the thickness of the organic photoelectric conversion layer, not limited to, for example, is in the range of $1\times10^{-8}$ m to $5\times10^{-7}$ m, preferably in the range of $2.5\times10^{-8}$ m to $3\times10^{-7}$ m, more preferably in the range of $2.5\times10^{-8}$ m to $2.5\times10^{-7}$ m, and still more preferably in the range of $1\times10^{-7}$ m to $2.5\times10^{-7}$ m.

In the image pickup element of Example 1, one of the anode 21 and the cathode 25 includes a transparent conductive material, and the other includes a metal material. Here, since in the image pickup element depicted in FIG. 1A, the light is made incident thereto from the side of the cathode, the cathode 25 includes a transparent conductive material (for example, ITO), and the anode 21 includes either Al—Nd (alloy of aluminum and neodymium) or ASC (alloy of aluminum, samarium, and copper). On the other hand, in the image pickup element depicted in FIG. 1B, the light is made incident thereto from the side of the anode, the anode 21 includes a transparent conductive material (for example, ITO), and the cathode 25 includes Al (aluminum), Al—Si—Cu (alloy of aluminum, silicon, and copper) or Mg—Ag (alloy of magnesium and silver).

The manufacture of the material (one material) having the structural formula (1) was carried out on the basis of Organic Letters (1999), 1(13), 2057 to 2060. In addition, after the resulting one material was sufficiently dried, it was sublimated by using a sublimation purification apparatus. Specifically, after the one material of powder of 11.0 g was put in the sublimation purification apparatus, and a temperature is raised from room temperature up to 330° C. for two hours, it was held at 330° C. for four hours, and next, crystallized within a recovery furnace heated at 310° C., thereby collecting the crystalline powder of the one material. The crystalline powder of 5.2 g could be obtained. When the purity was confirmed by using a high performance liquid chromatography method (HPLC), the purity was proved to be 99.62%.

Figure 2A:
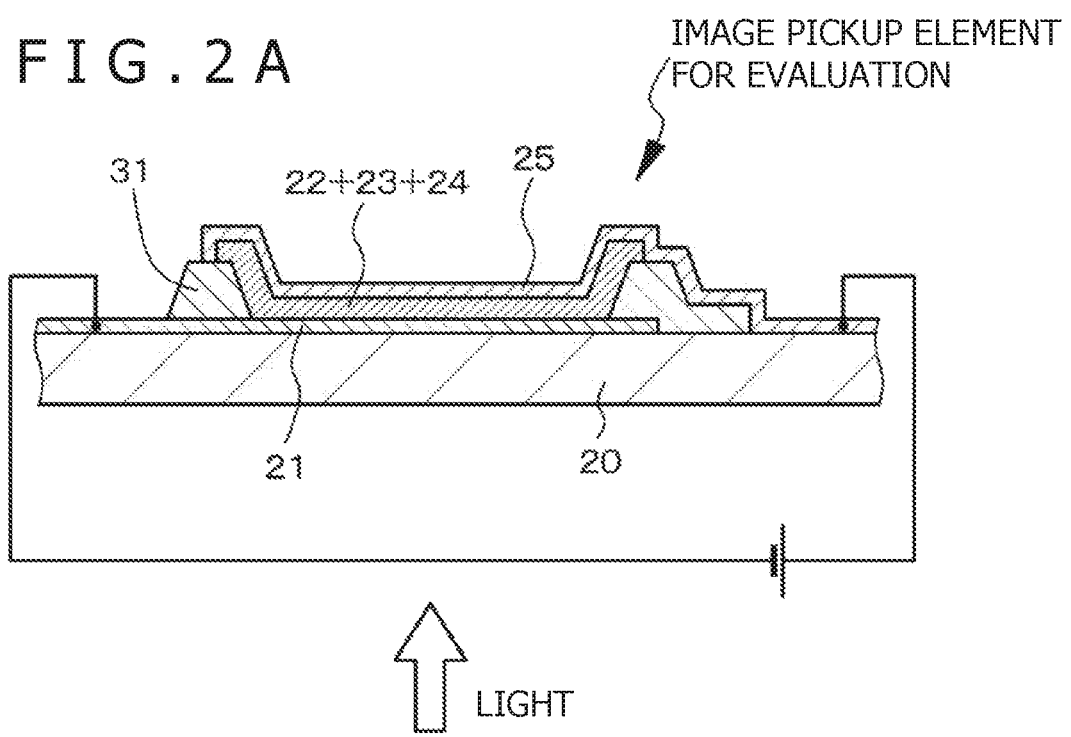
FIG. 2A and FIG. 2B are each a schematic partial cross-sectional view of an image pickup element for evaluation in Example 1, and a diagram schematically depicting flows of holes and electrons which are generated through photoelectric conversion.
Figure 2B:
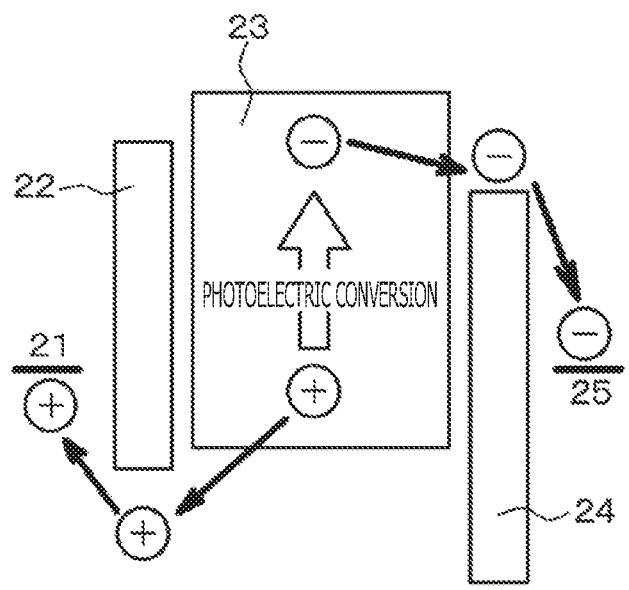

An image pickup element for evaluation depicted in a schematic partial cross-sectional view of FIG. 2A was manufactured by using the following method. It should be noted that the image pickup element for a green color was used as the image pickup element for evaluation.

An ITO film having a thickness of 120 nm was deposited on the substrate 20 constituted by a quartz substrate by using a sputtering system, and the anode 21 including the ITO film was obtained on the basis of a photolithography technique and an etching technique. Next, an insulating layer 31 was formed on the substrate 20 and the anode 21. After the insulating layer 31 was subjected to the patterning on the basis of the photolithography technique and the etching technique, thereby exposing the 1 mm-square anode 21, ultrasonic cleaning was carried out by using a detergent, acetone, and ethanol. In addition, after the substrate was dried, an ultraviolet rays/ozone process was further carried out for 10 minutes. Next, the substrate 20 was fixed to a substrate holder of a vacuum evaporation system, an evaporation chamber was decompressed to $5.5\times10^{-5}$ Pa.

After that, the anode-side buffer layer having a thickness of 5 nm and including a material having the following structural formula (3) was deposited on the basis of the vacuum evaporation method using a shadow mask. Next, the anode-side carrier blocking layer 22 having a thickness of 70 nm was deposited on the anode-side buffer layer. Specifically, firstly, a lower layer of the anode-side carrier blocking layer 22 having a thickness of 50 nm and having the structural formula (1) was deposited on the basis of an evaporation method. Next, the material having the structural formula (1) and quinacridone were deposited at an evaporation ratio of 1:1 on the basis of a co-evaporation method, thereby obtaining an upper layer, of the anode-side carrier blocking layer, as a co-evaporation layer having a thickness of 20 nm. That is to say, in Example 1, the carrier blocking layer 22 is constituted by a laminated structure of the layer including the layer including the material having the structural formula (1) and part (specifically, quinacridone) of the organic semiconductor material constituting the organic photoelectric conversion layer, and the layer including the material having the structural formula (1). The upper layer of the anode-side carrier blocking layer is constituted by a mixed layer (bulk-hetero structure) of the p-type organic semiconductor and the n-type organic semiconductor. In addition, furthermore, a lower layer (QD layer) of the photoelectric conversion material including QD having a thickness of 10 nm was continuously deposited on the anode-side carrier blocking layer 22 on the basis of the evaporation method. Moreover, an upper layer (QD: C1 layer), of the photoelectric conversion material layer, including quinacridone and sub-phthalocyanine chloride (SubPc-C1) was deposited at the evaporation rate of 1:1 by using the co-evaporation method to have a thickness of 120 nm. As a result, the photoelectric conversion material layer 23 was obtained. The upper layer (QD:C1 layer) of the photoelectric conversion material layer is constituted by a mixed layer (bulk-hetero structure) of the p-type organic semiconductor and the n-type organic semiconductor. Furthermore, the cathode-side buffer layer 24 having a thickness of 5 nm in material and having the following structural formula (4), and a lithium fluoride layer having a thickness of 0.5 nm was continuously formed in order. Thereafter, the cathode 25 having a thickness of 60 nm and including ITO was deposited by using a sputtering system, thereby obtaining an image pickup element for evaluation of Example 1 depicted in a schematic partial cross-sectional view of FIG. 2A.

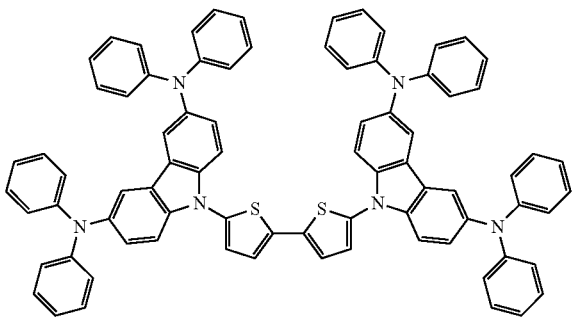

-continued

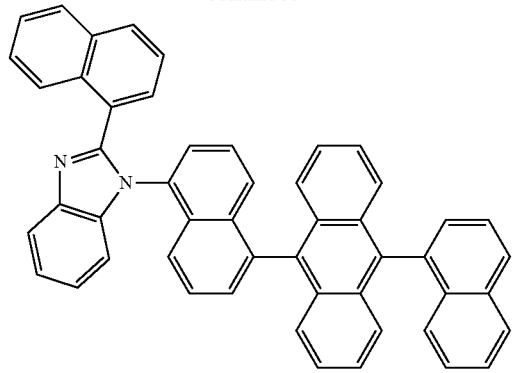

In Example 1, a wavelength of a light-absorption peak ($\lambda_{max}$) in a light absorption spectrum of the image pickup element (photoelectric conversion element) was 550±20 nm, specifically, 550 nm. In addition, $\lambda_{1/2}$=500 nm $\lambda_{-1/2}$=590 nm and thus the light absorption spectrum of the photoelectric conversion material layer had one local maximum value in the wavelength range of 450 nm to 650 nm.

Comparative Example 1A

In the image pickup element (photoelectric conversion element) of Example 1, the anode-side buffer layer having a thickness of 5 nm was deposited. Next, unlike Example 1, without forming the anode-side carrier blocking layer, the QD layer having a thickness of 10 nm, the QD: C1 layer having a thickness of 120 nm, the cathode-side buffer layer having a thickness of 5 nm, the lithium fluoride layer having a thickness of 0.5 nm, and the cathode having a thickness of 60 nm were deposited, thereby obtaining an image pickup element for evaluation of Comparative Example 1A (photoelectric conversion element).

Comparative Example 1B

In the image pickup element (photoelectric conversion element) of Example 1, the anode-side buffer layer having a thickness of 5 nm was deposited. Next, unlike Example 1, the layer (anode-side carrier blocking layer) having a thickness of 100 nm and having the structural formula (1) was formed. Without forming the anode-side carrier blocking layer including the material having the structural formula (1) and quinacridone, the QD layer having a thickness of 10 nm, the QD:C1 layer having a thickness of 120 nm, the cathode-side buffer layer having a thickness of 5 nm, the lithium fluoride layer having a thickness of 0.5 nm, and the cathode having a thickness of 60 nm were deposited, thereby obtaining an image pickup element for evaluation of Comparative Example 1B (photoelectric conversion element).

Comparative Example 1C

Figure 5:
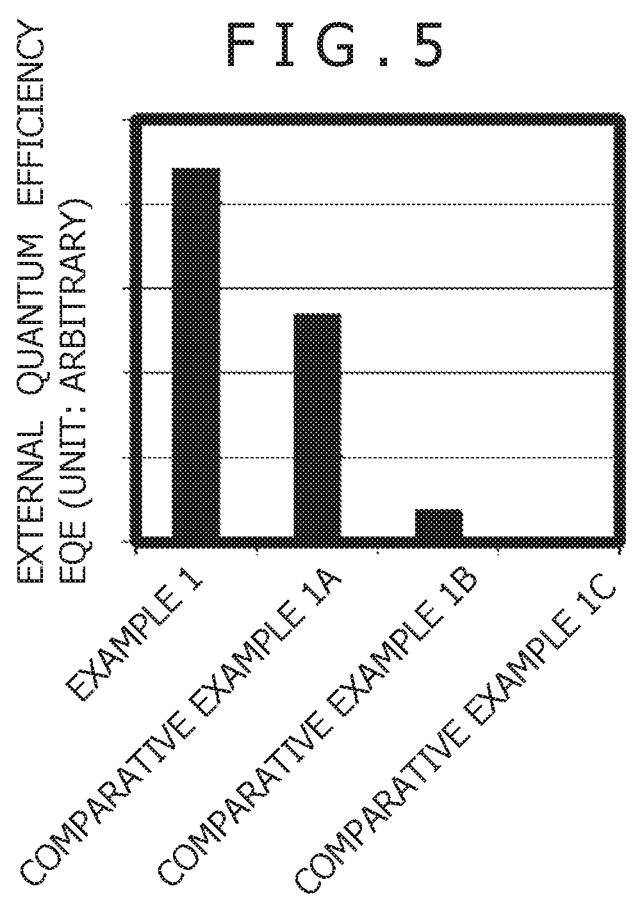
FIG. 5 is a graphical representation depicting external quantum efficiency-bias voltage characteristics of the image pickup element (photoelectric conversion element) with regard to Example 1, Comparative Example 1A, Comparative Example 1B, and Comparative Example 1C.

In the image pickup element (photoelectric conversion element) of Example 1, the anode-side buffer layer having a thickness of 5 nm was deposited. Next, unlike Example 1, a material layer having a thickness of 50 nm and having the following structural formula (5), and a layer including the material having a thickness of 20 nm and having the following structural formula (5), and quinacridone were formed as the anode-side carrier blocking layer. Moreover, the QD layer having a thickness of 10 nm, the QD:C1 layer having a thickness of 120 nm, the cathode-side buffer layer having a thickness of 5 nm, the lithium fluoride layer having a thickness of 0.5 nm, and the cathode having a thickness of 60 nm were deposited, thereby obtaining an image pickup element for evaluation of Comparative Example 1C (photoelectric conversion element).

ated current value J when the predetermined voltage (bias voltage) obtained from the photo-generated current value-bias voltage characteristics (J-V characteristics) is applied. It is understood that the photo-generated current value J (ampere/cm$^2$) is more increased in current J than each of Comparative Example 1A, Comparative Example 1B, and Comparative Example 1C, and especially is more extremely increased than each of Comparative Example 1B and Comparative Example 1C. In addition, FIG. 5 depicts an external

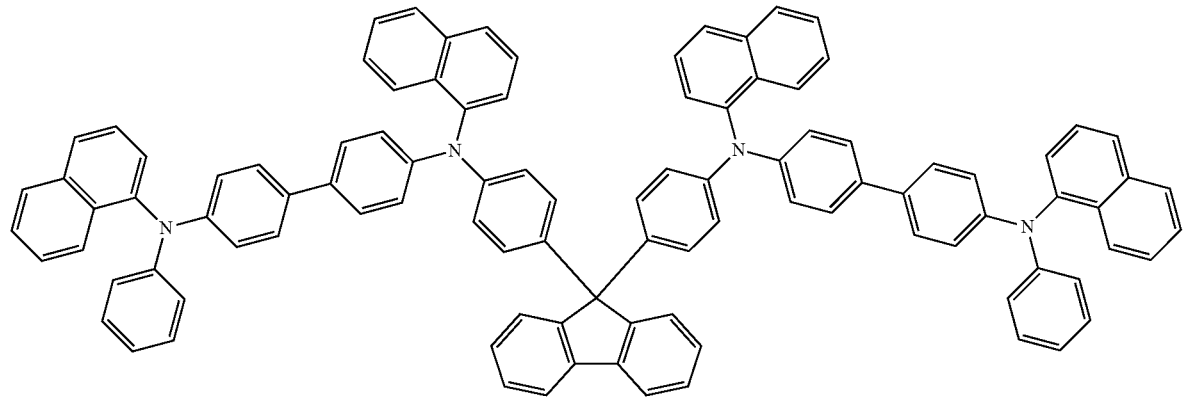 [SMILES: c1ccc(N(c2ccc(-c3ccc(N(c4ccc(C5(c6ccc(N(c7ccc(-c8ccc(N(c9ccccc9)c9cccc%10ccccc9%10)cc8)cc7)c7cccc8ccccc78)cc6)c6ccccc6-c6ccccc65)cc4)c4cccc5ccccc45)cc3)cc2)c2cccc3ccccc23)cc1]

The layer structures of the image pickup elements (photoelectric conversion elements) of Example 1, Comparative Example 1A, Comparative Example 1B, and Comparative Example 1C which have been described so far are listed in the following TABLE 1.

TABLE 1

|  | Example 1 | Comparative Example 1A | Comparative Example 1B | Comparative Example 1C |
|---|---|---|---|---|
| Cathode (ITO) | 60 nm | | | |
| LiF layer | 0.5 nm | | | |
| Cathode-side buffer layer | 5 nm | | | |
| Organic photoelectric conversion layer | | | | |
| QD:Cl layer | | | 120 nm | |
| QD layer | | | 10 nm | |
| Anode-side carrier blocking layer | | | | |
| Structural formula (1) + QD | 20 nm | — | — | |
| Structural formula (1) | 50 nm | — | 100 nm | |
| HTM-065 + QD | | | | 20 nm |
| HTM-065 | | | | 50 nm |
| Anode-side buffer layer | 5 nm | | | |
| Anode (ITO) | 120 nm | | | |

Figure 4:
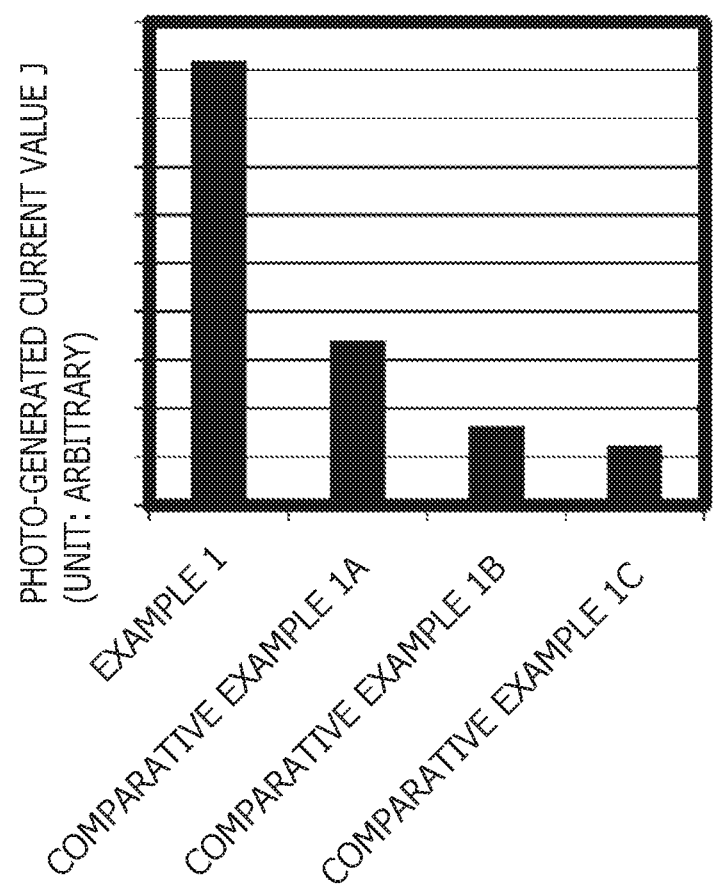
FIG. 4 is a graphical representation depicting photo-generated current value-bias voltage characteristics of an image pickup element (photoelectric conversion element) with regard to Example 1, Comparative Example 1A, Comparative Example 1B, and Comparative Example 1C.

Each of the image pickup elements (photoelectric conversion elements) for evaluation thus obtained of Example 1, Comparative Example 1A, Comparative Example 1B, and Comparative Example 1C was irradiated with the light having a given quality of light (=1.64 μW/cm$^2$) having a wavelength of 560 nm from the anode side to. In addition, in a state in which the cathode 25 was grounded, a predetermined voltage (bias voltage) was applied to the anode 21. A current value which is obtained at this time is photo-generated current value J. FIG. 4 depicts the photo-generquantum efficiency EQE when a predetermined voltage (bias voltage) obtained from an external quantum efficiency-bias voltage characteristics becoming an index of a sensitivity of the image pickup element (photoelectric conversion element) is applied. It is understood from FIG. 5 that the external quantum efficiency of the image pickup element (photoelectric conversion element) of Example 1 is more increased than each of Comparative Example 1A, Comparative Example 1B, and Comparative Example 1C, and especially is more extremely increased than each of Comparative Example 1B and Comparative Example 1C. That is to say, when Comparative Example 1A is compared with each of Comparative Example 1B and Comparative Example 1C, since in each of Comparative Example 1B and Comparative Example 1C, the thick anode-side carrier blocking layer is formed, the photo-generated current value J is reduced and the sensitivity of the image pickup element (photoelectric conversion element) is also reduced as compared with the case of Comparative Example 1A. On the other hand, although in Example 1, the thick anode-side carrier blocking layer is formed, Example 1 has the photo-generated current value J and the sensitivity which exceed those of Comparative Example 1A. That is to say, in the image pickup element (photoelectric conversion element) of Example 1, the anode-side carrier blocking layer contains not only the material having the structural formula (1), but also part of the organic semiconductor material constituting the organic photoelectric conversion layer. Thus, although the thick anode-side carrier blocking layer is formed, the reduction of the photo-generated current value J and the sensitivity is prevented from being caused. Moreover, as compared with the case of Comparative Example 1A, the image pickup element (photoelectric conversion element) of Example 1 contains part of the organic semiconductor material constituting the organic photoelectric conversion layer in the anode-side carrier blocking layer. Therefore, the photo-generated current value J and the sensitivity are raised and increased.

Figure 6:
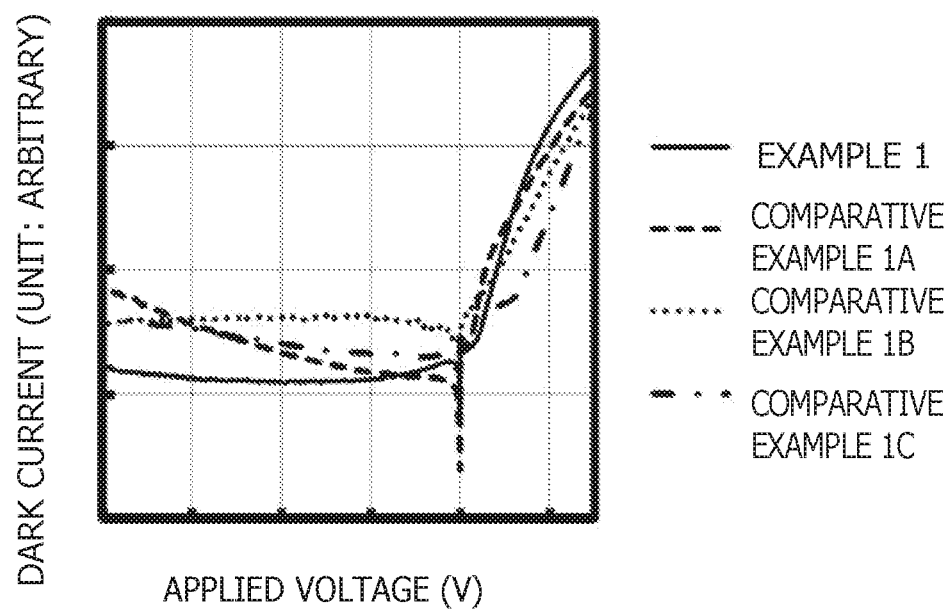
FIG. 6 is a graphical representation depicting dark current-bias voltage characteristics of the image pickup element (photoelectric conversion element) with regard to Example 1, Comparative Example 1A, Comparative Example 1B, and Comparative Example 1C.
Figure 7:
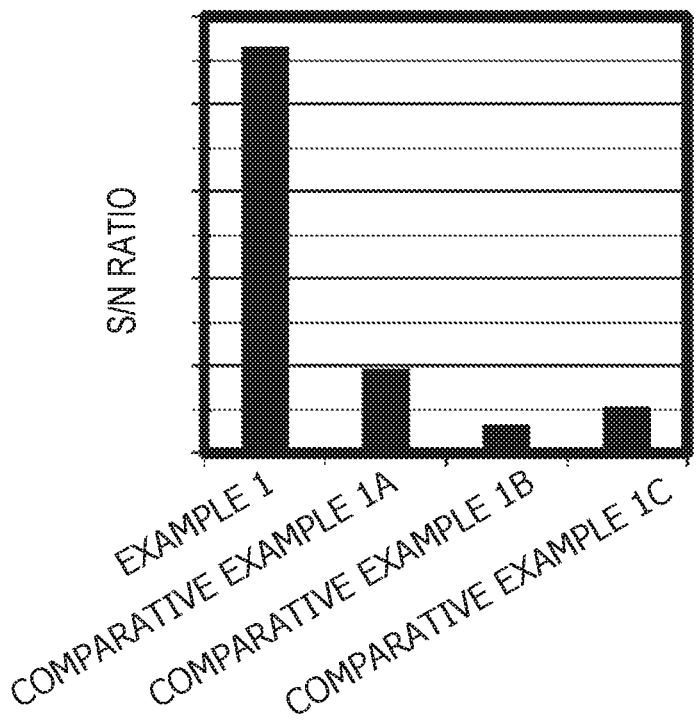
FIG. 7 is a graphical representation depicting an S/N ratio of the image pickup element (photoelectric conversion element) with regard to Example 1, Comparative Example 1A, Comparative Example 1B, and Comparative Example 1C.

In addition, in a state in which no light was irradiated, and the cathode 25 was grounded, a predetermined voltage (bias voltage) was applied to the anode 21. The J-V characteristics obtained at this time depicts a dark current of the image pickup element (photoelectric conversion element) (refer to FIG. 6). It is understood from FIG. 6 that the dark current J (ampere/cm$^2$) of Example 1 is reduced as compared with each of Comparative Example 1A, Comparative Example 1B, and Comparative Example 1C. That is to say, in the case of the image pickup element (photoelectric conversion element) of Example 1, the anode-side carrier blocking layer contains not only the material having the structural formula (1), but also part of the organic semiconductor material constituting the organic photoelectric conversion layer. Therefore, the dark current value is not increased at all. FIG. 7 depicts an S/N ratio obtained from a ratio of the photo-generated current value depicted in FIG. 4 to the dark current depicted in FIG. 6. The S/N ratio f the image pickup element (photoelectric conversion element) of Example 1 had an extremely high value as compared with each of Comparative Example 1A, Comparative Example 1B, and Comparative Example 1C.

FIG. 3 depicts a conceptual diagram of the image pickup device of Example 1. An image pickup device 40 of Example 1 is constituted by an image pickup region 41, a vertical drive circuit 42, a column signal processing circuit 43, a horizontal drive circuit 44, an output circuit 45, a control circuit 46, and the like which are peripheral circuits of the image pickup region 41. In this case, in the image pickup region 41, the image pickup elements 11 described above are arranged in a two-dimensional array on a semiconductor substrate (for example, a silicon semiconductor substrate). Incidentally, it goes without saying that these circuits can be configured with the well-known circuits, and can also configured using other circuit configurations (for example, various circuits used in the past charge-coupled device (CCD) image pickup device or complementary MOS (CMOS) image pickup device).

The control circuit 46 generates a lock signal and a control signal which become a reference of operations of the vertical drive circuit 42, the column signal processing circuit 43, and the horizontal drive circuit 44 on the basis of a vertical synchronous signal, a horizontal synchronous signal, and a master clock. In addition, the clock signal and control signal thus generated are inputted to the vertical drive circuit 42, the column signal processing circuit 43, and the horizontal drive circuit 44.

The vertical drive circuit 42, for example, is configured by a shift register, and selectively scans the image pickup elements 11 of the image pickup region 41 successively in a vertical direction in units of a raw. In addition, pixel signals based on currents (signals) which are generated in correspondence to quantities of received light in the image pickup elements 11 are sent to the column signal processing circuit 43 through vertical signal lines 47.

The column signal processing circuit 43, for example, is arranged every column of the image pickup elements 11 and carries out the signal processing for the noise removal and the signal amplification for the signals outputted from the image pickup elements 11 for one raw by the signal from a black reference pixel (formed in a circumference of an effective pixel area although not depicted) every image pickup element. In an output stage of the column signal processing circuit 43, a horizontal selection switch (not depicted) is connected and provided between itself and the horizontal signal line 48.

The horizontal drive circuit 44, for example, is configured by a shift register. The horizontal drive circuit 44 successively selects the column signal processing circuits 43 by successively outputting horizontal scanning pulses, and outputs the signals from the column signal processing circuits 43 to the horizontal signal line 48.

The output circuit 45 executes signal processing for the signals which are successively supplied through the horizontal signal line 48 from the column signal processing circuits 43, and outputs the resulting signals.

Here, since the organic photoelectric conversion layer itself functions as the color filter as well, the color separation is possible even when no color filter is arranged.

As has been described so far, in the image pickup element (photoelectric conversion element) of Example 1, the carrier blocking layer contains not only the material exhibiting less absorption of the visible light and having the structural formula (1), but also part of the organic semiconductor material constituting the organic photoelectric conversion layer. Therefore, the excellent carrier transport ability can be given. In addition, the image pickup element (photoelectric conversion element) of Example 1 can obtain the satisfactory external quantum efficiency, have the high sensitivity and suppress the dark current, and attain the high S/N ratio. Moreover, the carrier blocking layer can be thickened, and thus the reduced capacitance promotion of the electric capacitance can be attained. As a result of the above, it is possible to realize the image pickup device which enables the beautiful view out. In addition, thickening the photoelectric conversion material layer enables the area of the image pickup elements in the image pickup device to be increased. In addition, the drive at the low bias voltage is possible.

Example 2

Figure 8A:
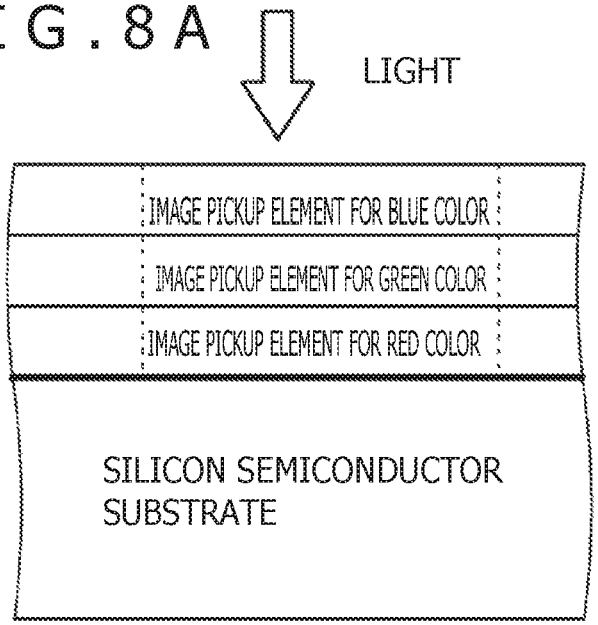
FIG. 8A and FIG. 8B are conceptual views of a laminated image pickup element of Example 2.

Although Example 2 is a modified change of the image pickup element of Example 1, Example 2 relates to the laminated image pickup element of the present disclosure, and the image pickup device according to a second aspect of the present disclosure. That is to say, in the laminated image pickup element (image pickup element of longitudinal spectroscopic system) of Example 2, at least two image pickup elements described in Example 1 are laminated on each other. In addition, the image pickup device of Example 2 is provided with a plurality of such laminated image pickup elements. Specifically, the laminated image pickup element of Example 2, as depicted in a conceptual view of FIG. 8A, has a structure in which the three image pickup elements (three sub-pixels: the image pickup element for a blue color; the image pickup element for a green color; and the image pickup element for a red color which are described in Example 1) are laminated on one another in the vertical direction. That is to say, it is possible to obtain the laminated image pickup element having the structure in which the sub-pixels are laminated on one another to be made one pixel. The image pickup element for a blue color is located in the uppermost layer, the image pickup element for a green color is located in the intermediate layer, and the image pickup element for a red color is located in the lowermost layer. However, the order of the lamination is by no means limited thereto.

Figure 8B:
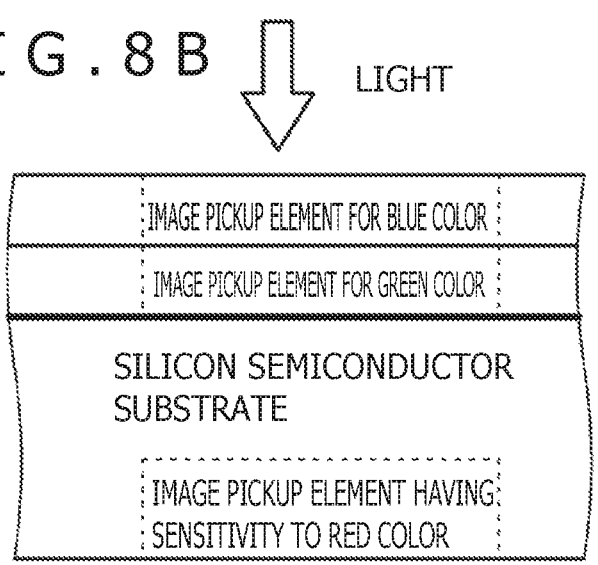

Alternatively, as depicted in a conceptual view of FIG. 8B, the image pickup elements (in a depicted example, the image pickup element for a blue color and the image pickup element for a green color) each described in Example 1 are provided on the silicon semiconductor substrate and one or a plurality of image pickup elements (in the depicted example, the image pickup element having the sensitivity to the red color) is provided in the inside of the silicon semiconductor substrate located below such image pickup elements. As a result, it is possible to obtain the laminated image pickup element having the structure in which the image pickup elements are laminated on one another, that is, the structure in which the sub-pixels are laminated on one another to be made one pixel. It should be noted that the image pickup elements formed on(in) the silicon semiconductor substrate is preferably of a backside illumination type, instead thereof, a surface illumination type can also be adopted.

Instead of providing the photoelectric conversion layer in the inside of the silicon semiconductor substrate, the image pickup element can also be formed on the semiconductor substrate by using an epitaxial growth method, or can also be formed on a silicon layer on(in) the so-called silicon on insulator (SOI) structure.

It should be noted that in the laminated image pickup element of Example 2, for the purpose of disturbing the light reception of the image pickup element located below, in the image pickup element located above, the anode, for example, includes the transparent conductive material such as ITO, and the cathode, for example, also includes the transparent conductive material such as ITO.

In the image pickup device of Example 2 provided with the laminated image pickup elements, the spectrum of the blue color, the green color, and the red color is not carried out by using the color filters, but the image pickup elements having the sensitivities to the light having a plurality of kinds of wavelengths are laminated on one another in the direction of incidence of the light within the same pixels. Therefore, it is possible to enhance the improvement in the sensitivity, and the improvement in the pixel density per unit volume. In addition, since the organic material has the high absorption efficient, the thickness of the organic photoelectric conversion layer can be more thinned than those of the past Si system photoelectric conversion layer. In addition, it is possible to relax the light leakage from the adjacent pixel(s), and the limitation of an incidence angle of the light. Moreover, in the past Si system image pickup element, the false color occurs because the color signals are produced by executing the interpolation processing among the pixels corresponding to the three colors. However, in the image pickup device of Example 2 provided with the laminated image pickup elements, the occurrence of the false color is suppressed.

Above, although the present disclosure has been described so far on the basis of preferred Examples, the present disclosure is by no means limited to these preferred Examples. The structures, the configurations, the manufacturing conditions, the manufacturing methods, and the used materials of the image pickup element, the laminated image pickup element, and the image pickup device which have been described in Examples are exemplifications, and thus can be suitably changed. When the photoelectric conversion element of the present disclosure is made to function as the solar cell, it is only necessary to irradiate the photoelectric conversion material layer with the light in a state in which no voltage is applied across the anode and the cathode.

It should be noted that the present disclosure can also adopt the following constitutions.

[A01]<<Image Pickup Element>>

An image pickup element in which at least an anode, a carrier blocking layer, an organic photoelectric conversion layer, and a cathode are laminated in order,
in which the carrier blocking layer includes a material having the following structural formula (1), and part of an organic semiconductor material constituting the organic photoelectric conversion layer.

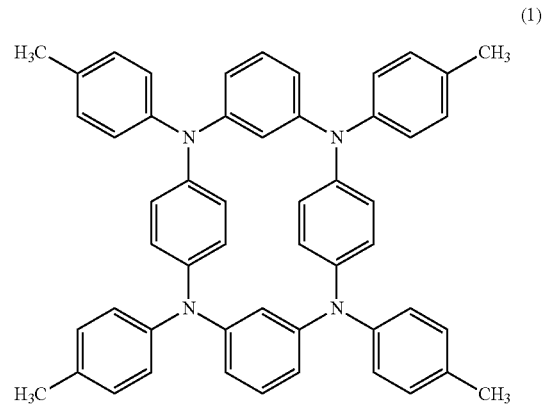

[A02] The image pickup element described in [A01], in which the part of the organic semiconductor material constituting the organic photoelectric conversion layer includes quinacridone or a quinacridone derivative.

[A03] The image pickup element described in [A01] or [A02], in which the carrier blocking layer is structured by a laminated structure of the layer including the material having the structural formula (1), and the part of the organic semiconductor material constituting the organic photoelectric conversion layer, and a layer including the material having the structural formula (1).

[A04] The image pickup element described in any one of [A01] to [A03], in which the anode and the cathode include a transparent conductive material.

[A05] The image pickup element described in any one of [A01] to [A03], in which one of the anode and the cathode includes the transparent conductive material, and the other includes a metallic material.

[A06] The image pickup element described in [A05], in which the anode includes the transparent conductive material, and the cathode includes Al, Al—Si—Cu or Mg—Ag.

[A07] The image pickup element described in [A05], in which the cathode includes a transparent conductive material, and the anode includes Al—Nd or ASC.

[B01]<<Laminated Image Pickup Element>>

A laminated image pickup element, in which at least two image pickup elements each described in any one of [A01] to [A07] are laminated.

[C01]<<Image Pickup Device: First Aspect>>

An image pickup device provided with a plurality of image pickup elements each described in any one of [A01] to [A07].

[C02]<<Image Pickup Device: Second Aspect>>

An image pickup device provided with a plurality of laminated image pickup elements each described in [B01].

[D01]<<Photoelectric Conversion Element>>

A photoelectric conversion element in which at least an anode, a carrier blocking layer, an organic photoelectric conversion layer, and a cathode are laminated in order, in which the carrier blocking layer includes a material having the following structural formula (1), and part of an organic semiconductor material constituting the organic photoelectric conversion layer.

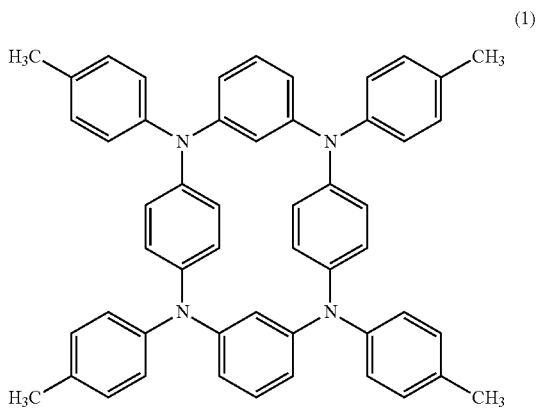

(1)

REFERENCE SIGNS LIST

11 . . . Image pickup element, 20 . . . Substrate, 21 . . . Anode, 22 . . . Carrier blocking layer (anode-side carrier blocking layer), 23 . . . Organic photoelectric conversion layer, 24 . . . Cathode-side buffer layer, 25 . . . Cathode, 31 . . . Insulating layer, 40 . . . Image pickup device, 41 . . . Image pickup region, 42 . . . Vertical drive circuit, 43 . . . Column signal processing circuit, 44 . . . Horizontal drive circuit, 45 . . . Output circuit, 46 . . . Control circuit, 47 . . . Vertical signal line, 48 . . . Horizontal signal line

The invention claimed is:

1. An image pickup element, comprising:
at least an anode, a carrier blocking layer, an organic photoelectric conversion layer, and a cathode laminated in order, wherein
the organic photoelectric conversion layer includes an organic semiconductor material, and
the carrier blocking layer includes:
a part of the organic semiconductor material; and
a specific material having the following structural formula (1):

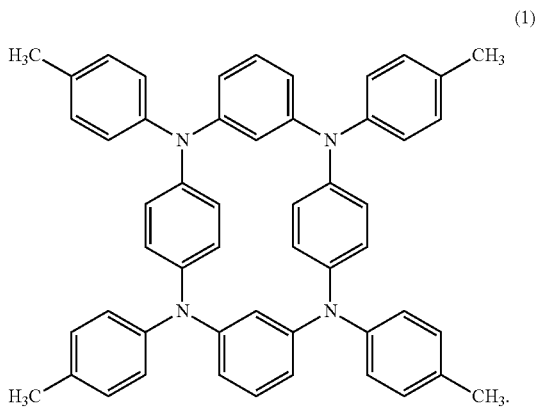

(1)

2. The image pickup element according to claim 1, wherein the part of the organic semiconductor material includes one of quinacridone or a quinacridone derivative.

3. The image pickup element according to claim 1, wherein the carrier blocking layer has a laminated structure, and the laminated structure of the carrier blocking layer includes:

a first layer including:
the specific material having the structural formula (1), and
the part of the organic semiconductor material; and
a second layer including the specific material having the structural formula (1).

4. The image pickup element according to claim 1, wherein each of the anode and the cathode includes a transparent conductive material.

5. The image pickup element according to claim 1, wherein
one of the anode and the cathode includes a transparent conductive material, and
other of the one of the anode and the cathode includes a metallic material.

6. The image pickup element according to claim 5, wherein
the anode includes the transparent conductive material, and
the cathode includes one of aluminium (Al), an alloy of Al, silicon, and copper (Al—Si—Cu), or an alloy of magnesium and silver (Mg—Ag).

7. The image pickup element according to claim 5, wherein
the cathode includes the transparent conductive material, and
the anode includes one of an alloy of aluminium and neodymium (Al—Nd) or an alloy of aluminium, samarium, and copper (ASC).

8. A laminated image pickup element, comprising:
a first image pickup element laminated with a second image pickup element, wherein each of the first image pickup element and the second image pickup element includes:
at least an anode, a carrier blocking layer, an organic photoelectric conversion layer, and a cathode laminated in order, wherein
the organic photoelectric conversion layer includes an organic semiconductor material, and
the carrier blocking layer includes:
a part of the organic semiconductor material; and
a specific material having the following structural formula (1):

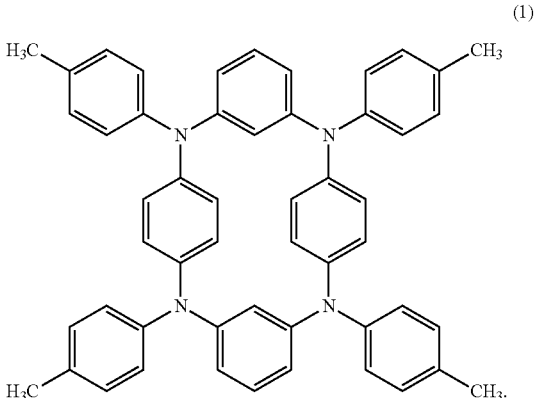

(1)

9. An image pickup device, comprising:
a plurality of image pickup elements, wherein each image pickup element of the plurality of image pickup elements includes:

at least an anode, a carrier blocking layer, an organic photoelectric conversion layer, and a cathode laminated in order, wherein
the organic photoelectric conversion layer includes an organic semiconductor material, and
the carrier blocking layer includes:
a part of the organic semiconductor material; and
a specific material having the following structural formula (1):

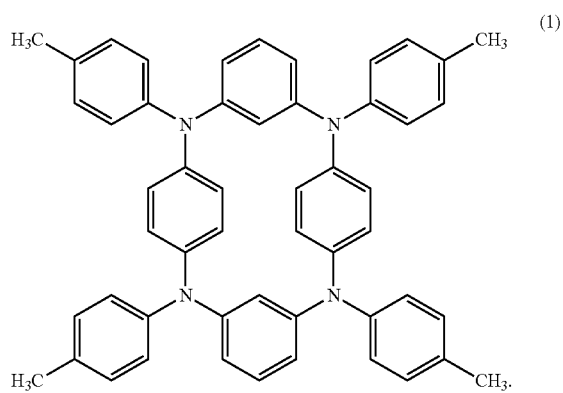 [SMILES: Cc1ccc(-n2c3ccc(cc3)n(-c3ccc(C)cc3)c3cccc(c3)n(-c3ccc(C)cc3)c3ccc(cc3)n(-c3ccc(C)cc3)c3cccc2c3)cc1]

10. An image pickup device, comprising:
a plurality of laminated image pickup elements, wherein each of the plurality of laminated image pickup elements includes a first image pickup element laminated with a second image pickup element, and
each of the first image pickup element and the second image pickup element includes:
at least an anode, a carrier blocking layer, an organic photoelectric conversion layer, and a cathode laminated in order, wherein
the organic photoelectric conversion layer includes an organic semiconductor material, and
the carrier blocking layer includes:
a part of the organic semiconductor material; and
a specific material having the following structural formula (1):

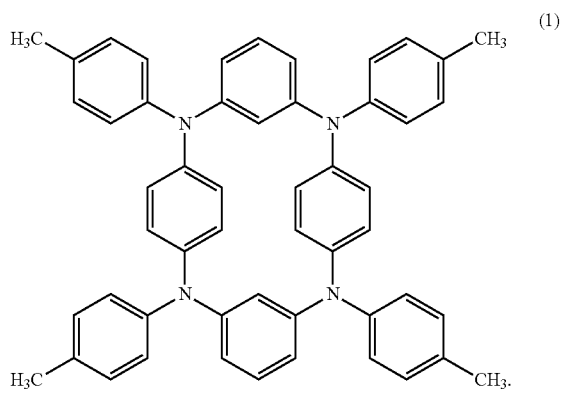 [SMILES: Cc1ccc(-n2c3ccc(cc3)n(-c3ccc(C)cc3)c3cccc(c3)n(-c3ccc(C)cc3)c3ccc(cc3)n(-c3ccc(C)cc3)c3cccc2c3)cc1]

11. A photoelectric conversion element, comprising:
at least an anode, a carrier blocking layer, an organic photoelectric conversion layer, and a cathode laminated in order, wherein
the organic photoelectric conversion layer includes an organic semiconductor material, and
the carrier blocking layer includes:
a part of the organic semiconductor material; and
a specific material having the following structural formula (1):

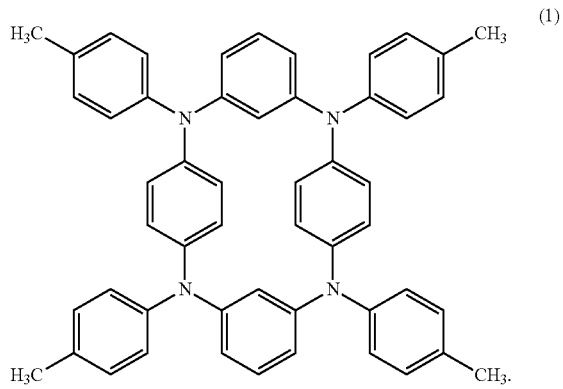 [SMILES: Cc1ccc(-n2c3ccc(cc3)n(-c3ccc(C)cc3)c3cccc(c3)n(-c3ccc(C)cc3)c3ccc(cc3)n(-c3ccc(C)cc3)c3cccc2c3)cc1]

* * * * *